(12) United States Patent
Nakayama

(10) Patent No.: US 9,190,158 B2
(45) Date of Patent: Nov. 17, 2015

(54) NON-VOLATILE SEMICONDUCTOR MEMORY DEVICE AND READING-OUT METHOD THEREFORE

(71) Applicant: POWERCHIP TECHNOLOGY CORPORATION, Hsin-Chu (TW)

(72) Inventor: Akitomo Nakayama, Tokyo (JP)

(73) Assignee: POWERCHIP TECHNOLOGY CORP., Hsin-Chu (TW)

( * ) Notice: Subject to any disclaimer, the term of this patent is extended or adjusted under 35 U.S.C. 154(b) by 236 days.

(21) Appl. No.: 13/801,139

(22) Filed: Mar. 13, 2013

(65) Prior Publication Data

US 2014/0036597 A1 Feb. 6, 2014

(30) Foreign Application Priority Data

Aug. 1, 2012 (JP) .................................. 2012-171200

(51) Int. Cl.
*G11C 16/26* (2006.01)
*G11C 16/04* (2006.01)

(52) U.S. Cl.
CPC ............ *G11C 16/26* (2013.01); *G11C 16/0483* (2013.01)

(58) Field of Classification Search
CPC .... G11C 16/0483; G11C 16/28; G11C 16/04; G11C 16/10; G11C 8/12; G11C 7/12; G11C 11/4093; G11C 11/4096; G11C 7/1048; G11C 7/1051; G11C 7/1045; G11C 7/1057
See application file for complete search history.

(56) References Cited

U.S. PATENT DOCUMENTS

| 7,511,999 B1 | 3/2009 | Kikuchi | |
|---|---|---|---|
| 2008/0055999 A1* | 3/2008 | Nakajima et al. | 365/185.18 |
| 2009/0244973 A1* | 10/2009 | Scheppler et al. | 365/185.09 |
| 2010/0177567 A1 | 7/2010 | Honma | |
| 2014/0104947 A1* | 4/2014 | Yamauchi et al. | 365/185.09 |

FOREIGN PATENT DOCUMENTS

| JP | H08125135 A | 5/1996 |
|---|---|---|
| JP | 2004005909 A | 1/2004 |
| JP | 2010165400 A | 7/2010 |
| JP | 2010165400 A1 | 7/2010 |
| TW | 535277 B | 6/2003 |
| TW | 584943 B | 4/2004 |
| TW | 200501390 A | 1/2005 |
| TW | 201140604 A | 11/2011 |

OTHER PUBLICATIONS

TW Office Action dated Jul. 29, 2015 from corresponding TW Appl No. 10421008310.

* cited by examiner

*Primary Examiner* — Hien Nguyen
(74) *Attorney, Agent, or Firm* — Muncy, Geissler, Olds & Lowe, P.C.

(57) ABSTRACT

In a non-volatile semiconductor memory device outputting a data value determined according to a majority rule by reading-out data from each memory cell for an odd number of times, an odd number of latch circuits, each of which comprises a capacitor for selectively holding a voltage of each of the data read-out from the memory cell for the odd number of times in sequence, is provided. The capacitor of each latch circuit is connected in parallel after the capacitor of each latch circuit selectively holds the voltage of each of the data read-out from the memory cell for the odd number of times in sequence, and the data value is determined by the majority rule based on a composite voltage of the capacitor of each latch circuit connected in parallel.

11 Claims, 21 Drawing Sheets

Eleventh embodiment

NON-VOLATILE SEMICONDUCTOR MEMORY DEVICE AND READING-OUT METHOD THEREFORE

CROSS REFERENCE TO RELATED APPLICATIONS

This application claims priority of Japan Patent Application No. 2012-171200, filed on Aug. 1, 2012, the entirety of which is incorporated by reference herein.

BACKGROUND OF THE INVENTION

1. Field of the Invention

The invention relates to an electrically rewritable non-volatile semiconductor memory device (EEPROM), such as a flash memory, and a reading-out method thereof.

2. Description of the Related Art

A highly integrated NAND-type non-volatile semiconductor memory device which connects a plurality of memory cell transistors (hereinafter referred to as memory cells) to and between bit lines and source lines in series to form a NAND string is well known in the art.

In a common NAND-type non-volatile semiconductor memory device, when erasing, a high voltage, such as 20V, is applied to a semiconductor substrate and 0V is applied to a word line. As such, electrons are pulled out from a floating gate, i.e., a charge accumulation layer formed by poly-silicon material etc., and a threshold voltage is lower than an erasing threshold voltage (for example, −3V). In addition, when performing write-in (programming), 0V is applied to the semiconductor substrate, and a high voltage, such as 20V, is applied to a control gate. As a result, electrons are injected from the semiconductor substrate into the floating gate, thereby making a threshold voltage higher than a write-in threshold voltage (for example, 1V). States of a memory cell which utilizes the threshold voltages may be determined by applying a readout voltage (for example, 0V) between the write-in threshold voltage and a readout threshold voltage to the control gate to determine whether a current is flowing through the memory cell.

FIG. 18 illustrates a configuration example of an EEPROM according to the first conventional example disclosed in Patent Document 1. In FIG. 18, a memory chip 100 and a controller 160 are illustrated. The memory chip 100 comprises a memory cell array 101 connected to a row decoder circuitry 111 and a column decoder circuitry 113. A reading-out circuitry 121 comprises a sense amplifier and any other relevant circuitry. The output of the reading-out circuitry 121 is supplied to a set of registers. A bus 130 connecting the memory chip 100 to the controller 160 transfers data and addresses, commands, parameters, and so on between the controller 160 and the memory chip 100. Here, an example in which the composite value of the read-out data is formed in the memory chip 100 and then passed to the controller to be output to a host is shown. In FIG. 18, an averaging circuit of the read-out data is shown. The averaging circuit, consisting of an accumulator 123 and a divider 129, calculates a mean based on individual read-out data by the accumulator and the divider.

PATENT DOCUMENTS

[Patent Document 1] JP 2004-005909
[Patent Document 2] JP 2010-165400

BRIEF SUMMARY OF THE INVENTION

Problems to be Solved

FIG. 19 is a graphic illustrating the number of memory cells versus the threshold voltage for explaining the sensing margin in the flash EEPROM of FIG. 18, and FIG. 20 is a graphic illustrating time variations in the reading-out current I(t) in the EEPROM of FIG. 18. In the EEPROM of FIG. 18, as shown in FIG. 19, reading-out of data from memory cells is performed by detecting cell current of a bit line using a predetermined word line voltage Vread. After cycles of programming and erasing of data, for many memory cells, threshold voltage is close between different data values, and in many circumstances the sensing margin when reading-out different data values is not sufficient. The threshold voltage of the detected cell always varies because of reasons described below, and thus the variation ΔI occurs in the reading-out current I as shown in FIG. 20 and the erroneous reading-out of data arises.

(1) RTS (Random Telegraph Signal) noise;
(2) Transfer of trapped charges;
(3) Instability of the sensing circuit and noise generated thereby; and
(4) Variations in the reading-out voltage Vread and noise generated thereby.

For solving the problems, in the first conventional example described above, a plurality of read-out data is averaged, and that is to say, multiple times of the reading-out method and a determination method of the majority rule are used.

FIG. 21 is a block diagram illustrating a configuration example of a latch unit in a sense amplifier circuit in an EEPROM according to the second conventional example disclosed by Patent Document 2. In FIG. 21, 221~236 are MOS transistors, 237 is a transfer gate, and IV201~IV205 are inverters. Here, the MOS transistors 223 and 224 are transistors for detecting data read-out from memory cells, and the inverters IV201 and IV202 forms a latch circuit temporarily storing data for logic operations. For performing the operation of the majority rule, the latch unit according to the second conventional example is configured to include three latches 0DL~2DL storing a plurality of data read-out from the same memory cell, to perform operations of logical addition and inversion by the MOS transistors 229, 230, 233 and 234, to perform operations of logical product and inversion by the MOS transistor 227, 228, 231 and 232, and to output data of the result of the performed operations.

However, the second conventional example of FIG. 21 has following problems.

(1) Since the circuit for the logical operations is added into the said latch unit, the circuit size becomes extremely large.
(2) Because each logical operation is performed sequentially, the operation of the majority rule takes a lot of time.

The purpose of the invention is to solve the problems described above. Accordingly, regarding the non-volatile memory device that performs reading-out of data using the majority rule, a non-volatile semiconductor memory device which is capable of shortening the process time drastically compared to prior arts and reducing the circuit size and a reading-out method thereof are provided.

Means for Solving the Problems

A non-volatile semiconductor memory device according to an embodiment of the invention is configured to output a data value determined according to a majority rule by reading-out data from each of a plurality of memory cells for an odd number of times not less than three times. The plurality of memory cells is connected to corresponding word lines and connected to and between a plurality of bit lines and a plurality of source lines. The non-volatile semiconductor memory device comprises: an odd number of latch circuits, which are not less than three latch circuits, each of which comprising a capacitor for selectively holding a voltage of each of the data read-out from the memory cell for the odd number of times in sequence; and a control circuit, connecting the capacitor of each of the odd number of latch circuits in parallel after the capacitor of each of the odd number of latch circuits selectively holding the voltage of each of the data read-out from the memory cell for the odd number of times in sequence, and determining the data value by the majority rule based on a composite voltage of the capacitor of each of the odd number of latch circuits connected in parallel.

In the non-volatile semiconductor memory device described above, each of the odd number of latch circuits comprises a latch consisted of two inverters connected to each other and the capacitor.

Moreover, in the non-volatile semiconductor memory device, each of the odd number of latch circuits comprises a selective transistor which is switched to or not to select the latch circuit and the capacitor.

The non-volatile semiconductor memory device described above further comprises: a latch circuit in replace of the odd number of latch circuits, comprising an odd number of transistors connected to each other in serial and an odd number of capacitors connected to connection points among the odd number of transistors and a transistor terminal which is farthest away from an input/output terminal of the latch circuit.

In addition, the non-volatile semiconductor memory device described above further comprises: a sensing circuit connected to each of the odd number of latch circuits, connecting the capacitor of each of the odd number of latch circuits in parallel and determining the data value by the majority rule based on the composite voltage of the capacitor of each of the odd number of latch circuits connected in parallel.

Here, the sensing circuit comprises: a selective transistor which is switched to or not to select the sensing circuit; and a latch, comprising two inverters, sensing and holding the voltage of each of the data.

Alternatively, the sensing circuit comprises: an inverter, sensing and outputting the voltage of each of the data; a holding capacitor, holding the voltage from the inverter; and a selective transistor which is switched to or not to output the voltage held by the holding capacitor to a circuit reading-out the data from each of the plurality of memory cells.

The non-volatile semiconductor memory device further comprises: another capacitor provided in a circuit where reading-out data from the plurality of memory cells is performed through a data sensing point connected to a sensing circuit for reading-out, wherein the another capacitor is connected to the data sensing point. The another capacitor is used in replace of one of the odd number of latch circuits.

In addition, in the non-volatile semiconductor memory device, each latch circuit is connected to the data sensing point.

Moreover, in the non-volatile semiconductor memory device, each latch circuit is connected to an input/output terminal of one latch circuit in a page buffer of the non-volatile semiconductor memory device.

Another embodiment of the invention provides a reading-out method of a non-volatile semiconductor memory device for outputting a data value determined according to a majority rule by reading-out data from each of a plurality of memory cells for an odd number of times not less than three times, wherein the plurality of memory cells are connected to corresponding word lines and connected to and between a plurality of bit lines and a plurality of source lines, and the non-volatile semiconductor memory device comprises an odd number of latch circuits, which are not less than three latch circuits, each of which comprising a capacitor for selectively holding a voltage of each of the data read-out from the memory cell for the odd number of times in sequence, the reading-out method comprising: connecting the capacitor of each of the odd number of latch circuits in parallel after the capacitor of each of the odd number of latch circuits selectively holding the voltage of each of the data read-out from the memory cell for the odd number of times in sequence, and determining the data value by the majority rule based on a composite voltage of the capacitor of each of the odd number of latch circuits connected in parallel.

Effect of the Invention

Accordingly, based on the non-volatile semiconductor device according to the invention and the reading-out method thereof, in the non-volatile memory device where the reading-out of data is performed by using the majority rule, the process time can be significantly shortened while the circuit size can be reduced in comparison with the prior arts.

BRIEF DESCRIPTION OF THE DRAWINGS

The invention can be more fully understood by reading the subsequent detailed description and examples with references made to the accompanying drawings, wherein:

FIG. 4(a) is a circuit diagram showing voltages when each of the capacitors C0~C2 stores data;

FIG. 4(b) is a circuit diagram showing voltages when the capacitors C0~C2 are connected in parallel;

DETAILED DESCRIPTION OF THE INVENTION

The embodiments of the invention are described below with references made to the accompanying drawings. The same element in every embodiment below is marked as the same symbol.

First Embodiment

Figure 1:
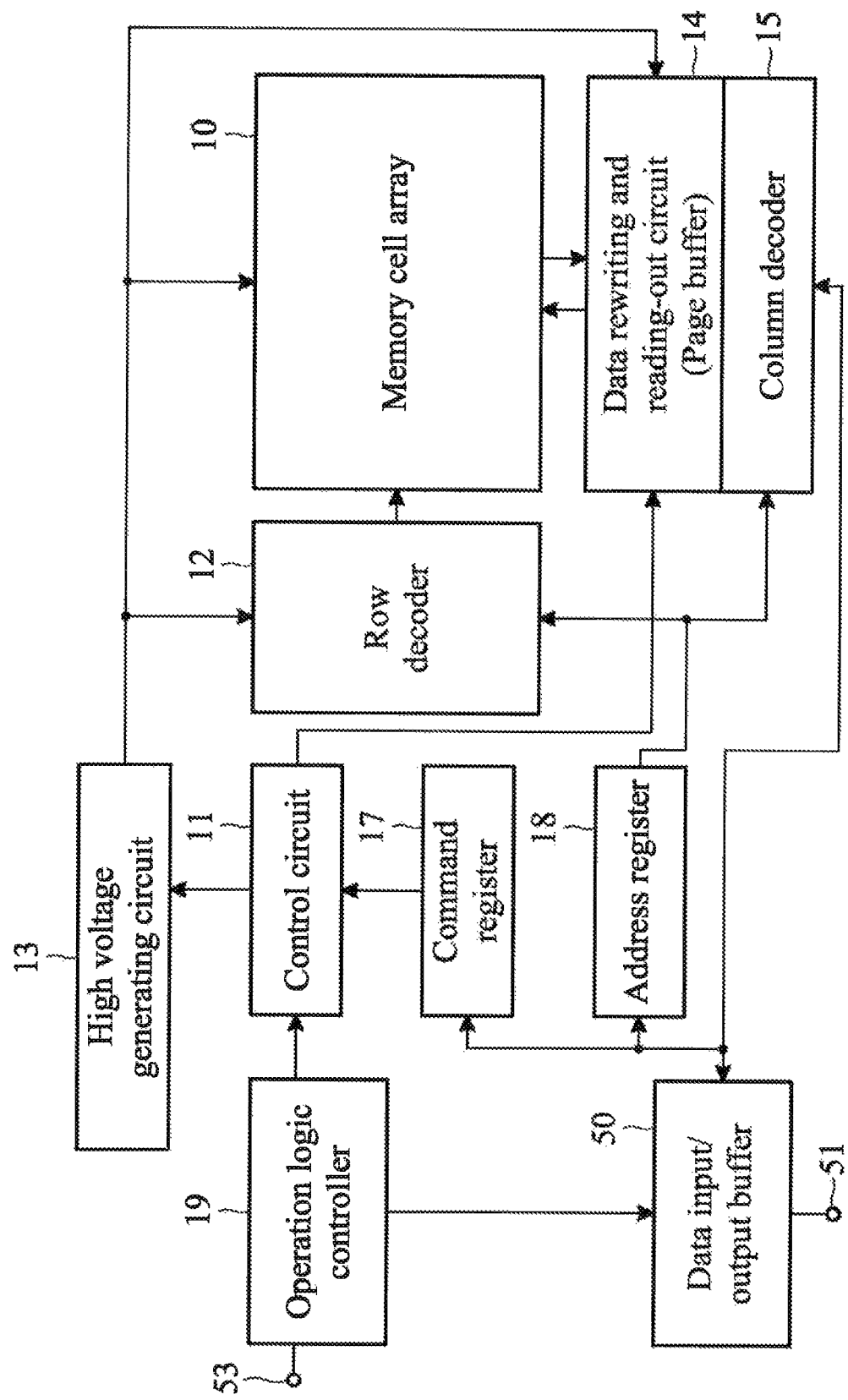
FIG. 1 is a block diagram showing an overall configuration of a NAND-type flash EEPROM according to the first embodiment of the invention.
Figure 2:
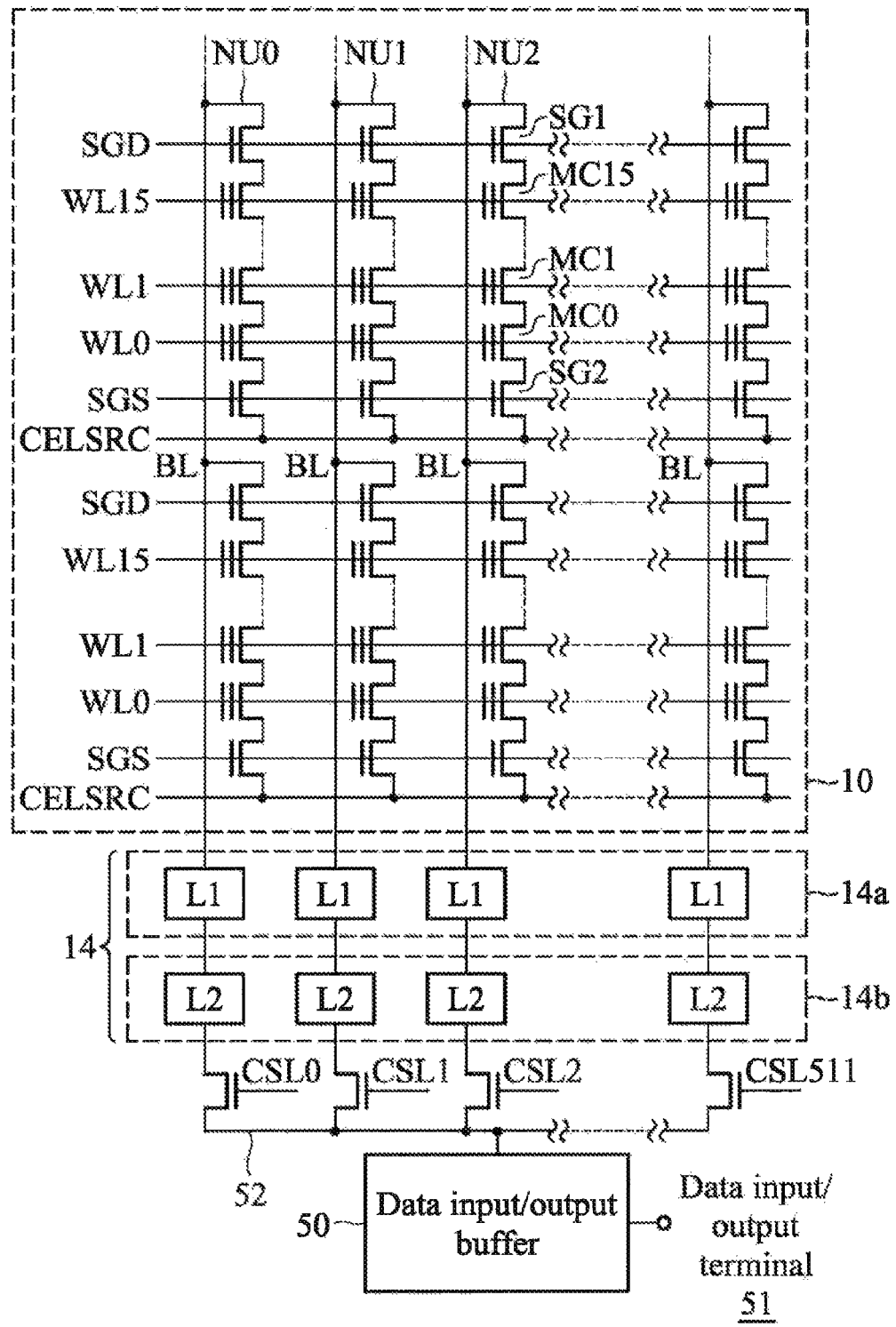
FIG. 2 is a circuit diagram showing a configuration of the memory cell array 10 of FIG. 1 and its peripheral circuit.

FIG. 1 is a block diagram showing an overall configuration of a NAND-type flash EEPROM according to the first embodiment of the invention. In addition, FIG. 2 is a circuit diagram showing a configuration of the memory cell array 10 in FIG. 1 and its peripheral circuit. First, the configuration of the NAND-type flash EEPROM according to the embodiment is described below.

In FIG. 1, the NAND-type flash EEPROM according to the embodiment comprises a memory cell array 10, a control circuit 11 for controlling operations of the memory cell array 10, is row decoder 12, a high voltage generating circuit 13, a data rewriting and reading-out circuit 14, a column decoder 15, a command register 17, an address register 18, an operation logic controller 19, a data input/output buffer 50, and a data input/output terminal 51.

As shown in FIG. 2, the memory cell array 10 is composed of NAND cell units NU (NU0, NU1 . . . ), each of which is formed by connecting, for example 16 stack-gate structured electrically rewritable non-volatile memory cells MC0~MC15 in serial. In each of the NAND cell units NU, a drain side is connected to a bit line BL through a selective gate transistor SG1, and a source side is connected to a common source line CELSRC through a selective gate transistor SG2. Control gates of memory cells MC lined in a row direction are collectively connected to word lines WL, and gate electrodes of the selective gate transistors SG1 and SG2 are connected to selective gate lines SGD and SGS arranged parallel to the word lines WL. One page, a unit for write-in and readout, is a range of memory cells selected by one of the word lines WL. One block, a unit for data erasing, is a range of a plurality of NAND cells NU in one page or its integer multiples. In order to perform write-in and readout of data of a page unit, the rewriting and reading-out circuit 14, called a page buffer below, comprises a sense amplifier circuit (SA) and a latch circuit (DL) provided for each bit line.

The memory cell array 10 in FIG. 2 has a simplified configuration, wherein a plurality of bit lines can share a page buffer. In this case, one page unit is a number of bit lines selectively connected to the page buffer when writing-in or reading-out data. In addition, FIG. 2 shows a range of the cell array where inputs and outputs of data are performed within one input/output terminal 51. In order to select word lines WL and bit lines BL of the memory array 10, the corresponding row decoder 12 and the corresponding column decode 15 are arranged. The control circuit 11 performs a sequence control for writing-in, erasing and reading-out data. The high voltage generating circuit 13 controlled by the control circuit 11 generates high voltages or middle voltages used for rewriting, erasing and reading-out data.

The input/output buffer 50 is used for input/output of data and input of address signals. That is, data is transmitted between the input/output terminal 51 and the page buffer 14 through the input/output buffer 50 and the data line 52. The address signals inputted from the input/output terminal 51 are stored in the address register 18 and sent to the row decoder 12 and the column decoder 15 for decoding. Commands of controlling operations are also inputted from the input/output terminal 51. The inputted commands are decoded and stored in the command register 17 so as to make the control circuit 11 perform controlling operations. External control signals, such as chip enable signals CEB, command latch enable signals CLE, address latch enable signals ALE, write-in enable signals WEB, readout enable signals REB, etc., are taken into the action logic controller 19, and internal control signals corresponding to operation modes are generated. The internal control signals are used for controlling of the input/output buffer 50, such as data latching, transmitting, etc., and are sent to the control circuit 11 so as to perform controlling operations.

The page buffer 14, comprising two latch circuits 14a and 14b, is configured to be capable of performing switching between functions of multi-valued operations and cache. In other words, when two-valued data of one bit is stored in one memory cell, a cache function is provided, and when four-valued data of two bits is stored in one memory cell, a cache function is provided and cache function is still effective even though it is limited by an address.

Figure 3:
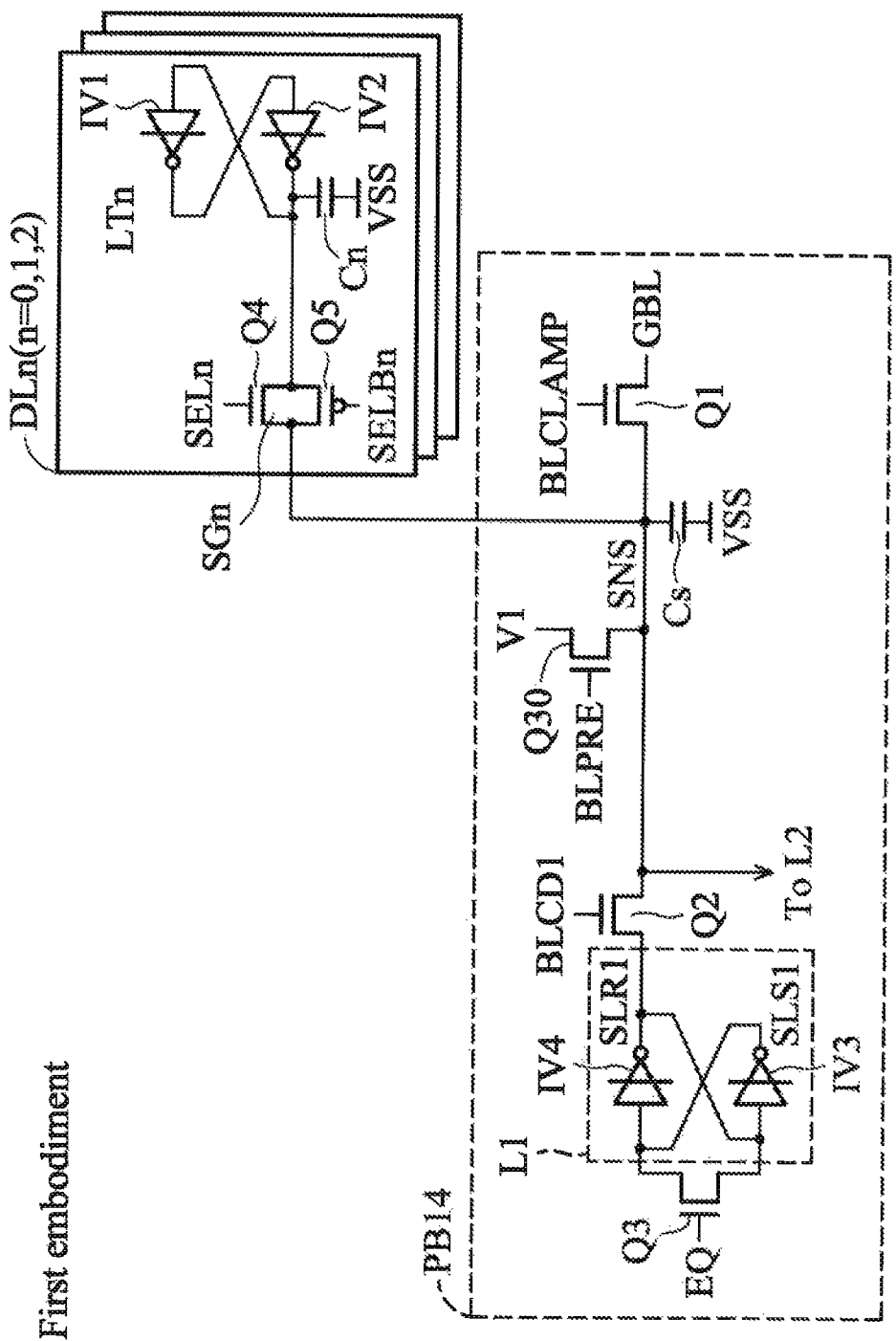
FIG. 3 is a circuit diagram showing a detailed configuration of a page buffer used in a NAND-type flash EEPROM according to the first embodiment of the invention and its peripheral circuit.

FIG. 3 is a circuit diagram showing a detailed configuration of the page buffer (PB) 14 used in the NAND-type flash EEPROM according to the first embodiment of the invention and its peripheral circuit (except the latch circuit L2). In FIG. 3, the page buffer 14 comprises latch circuits L1 and L2, MOS transistors Q1~Q3 controlled by control signals BLCLAMP, BLCD1 and EQ, respectively, and a capacitor Cs (<Cn) for holding a voltage of a data sensing point SNS. Here, the latch circuit L1 comprises two clocked inverters IV3 and IV4 to form a flip-flop type latch circuit. In addition, a global bit line GBL connected to the memory cells is connected to the data sensing point SNS through the MOS transistor Q1, and three latch circuits DL0~DL2 are connected to the data sensing point SNS in parallel. Here, each latch circuit DLn (n=0, 1, 2) is configured to comprise two clocked inverters IV1 and IV2, a capacitor Cn and a transfer gate SGn which is switched to or not to select the latch circuit (whether or not to allow passage of the voltage of data). When the transfer gate SGn is turned on, data of the data sensing point SNS is latched into a latch LTn through the transfer gate SGn and the capacitor Cn is charged to maintain the data. Moreover, the capacitors C0~Cn and Cs may be formed by MOS capacity according to well-known semiconductor process technologies.

Figure 4:
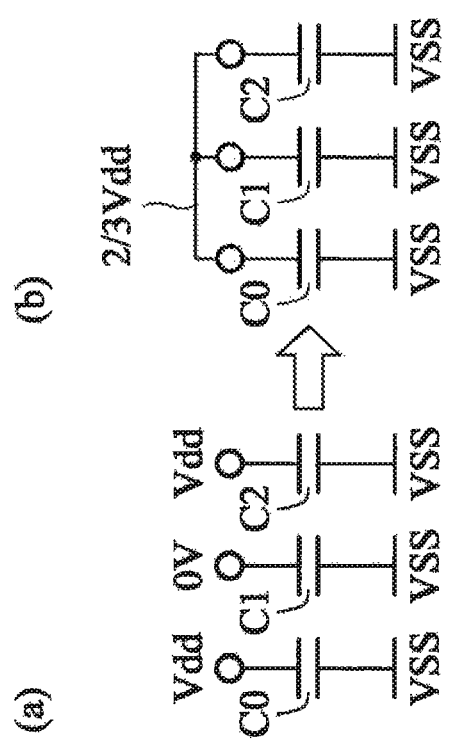
FIG. 4 is a circuit diagram for explaining the averaging of voltages held by capacitors during a data reading-out process in the page buffer according to the first embodiment.
Figure 5:
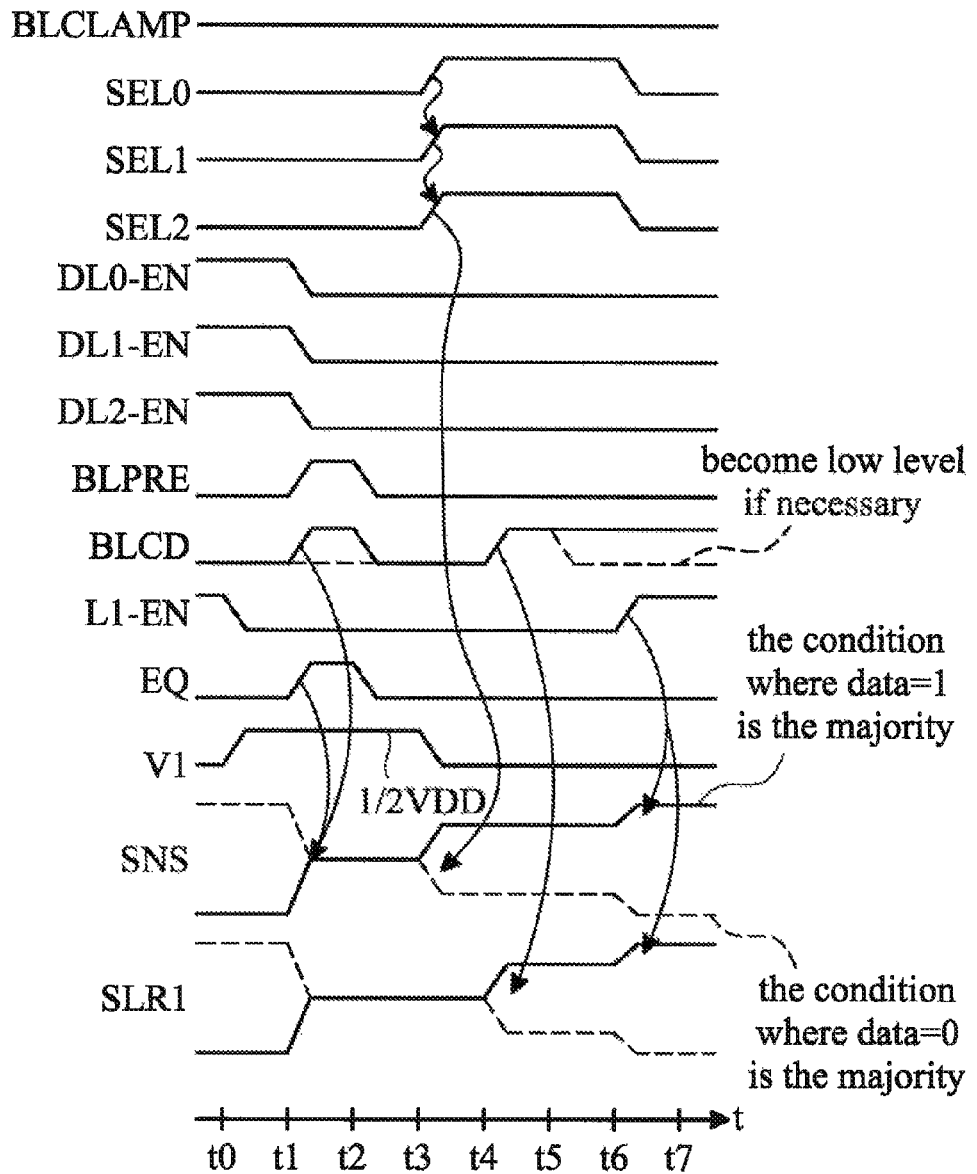
FIG. 5 is a timing chart of signals during the data reading-out process of FIG. 4.

FIG. 4 is a circuit diagram for explaining the averaging of voltages held by the capacitors C0~C2 during a data reading-out process in the page buffer 14. FIG. 4(a) is a circuit diagram showing voltages when each of the capacitors C0~C2 stores data. FIG. 4(b) is a circuit diagram showing voltages when the capacitors C0~C2 are connected in parallel. In addition, FIG. 5 is a timing chart of signals during the data reading-out process of FIG. 4. Moreover, in FIG. 5, DL0-EN~DL2-EN are driving control signals for the clocked inverters IV1 and IV2 of each latch circuit DLn, and L1-EN is a driving control signal for the clocked inverters IV3 and IV4 of the latch L1.

In the data reading-out method according to the embodiment, compared with the prior arts, the majority rule using the charge-sharing among the capacitors C0~C2 is more simplified. Each of a plurality of data sensed from the same memory cell is selectively stored in one of a plurality of latch circuits DLn, each of which comprises the latch LTn having the capacitor Cn, in sequence (FIG. 4(a)). At this moment, the transfer gate SGn of the latch circuit DLn which is selected to have data stored therein is turned on, while transfer gates SGn of other latch circuits DLn which are not selected to have data stored therein are turned off and input/output terminals of the latch circuits DLn are in a status of high impedance. Then, the latch circuit L1 is low enabled (time t1 in FIG. 5), a control signal BLPRE for pre-charging the global bit line GBL becomes a high level to turn on a MOS transistor Q30, and a pre-charge operation to ½ Vdd is started from the data sensing point SNS to SLR1 and SLS1 of the latch L1 by a voltage V1 (time t2 in FIG. 5). Clocked inverters of all latch circuits DL0~DL2 are low enabled (time t4 in FIG. 5), and control signals SEL0~SEL2 are at a high level, and all transfer gates SGn are turned on. Thus, all capacitors C0~C2 are connected in parallel, the charge-sharing among the capacitors C0~C2 is performed, and a composite voltage of the three capacitors C0~C2 becomes the averaged voltage (FIG. 4(b), time t7 in FIG. 5). At this moment, since the averaging of the voltages of the capacitors C0~C2 may be incorrect due to parasitic capacitance of the capacitor Cs of the data sensing point SNS, Cs<Cn is necessary.

Though a situation where the reading-out is performed for three times is shown in FIG. 4, when in a situation where the reading-out is performed for five times, if high-level data is read out for three times, the difference between the averaged voltage and a half of the power source voltage Vdd becomes (3/5−2.5/5)×Vdd. If Vdd=1.5 V, the difference would be 0.15 V. This value is enough for the sensing operation during the data reading-out process, and the data reading-out process can be performed more precisely compared with the prior arts.

Figure 6:
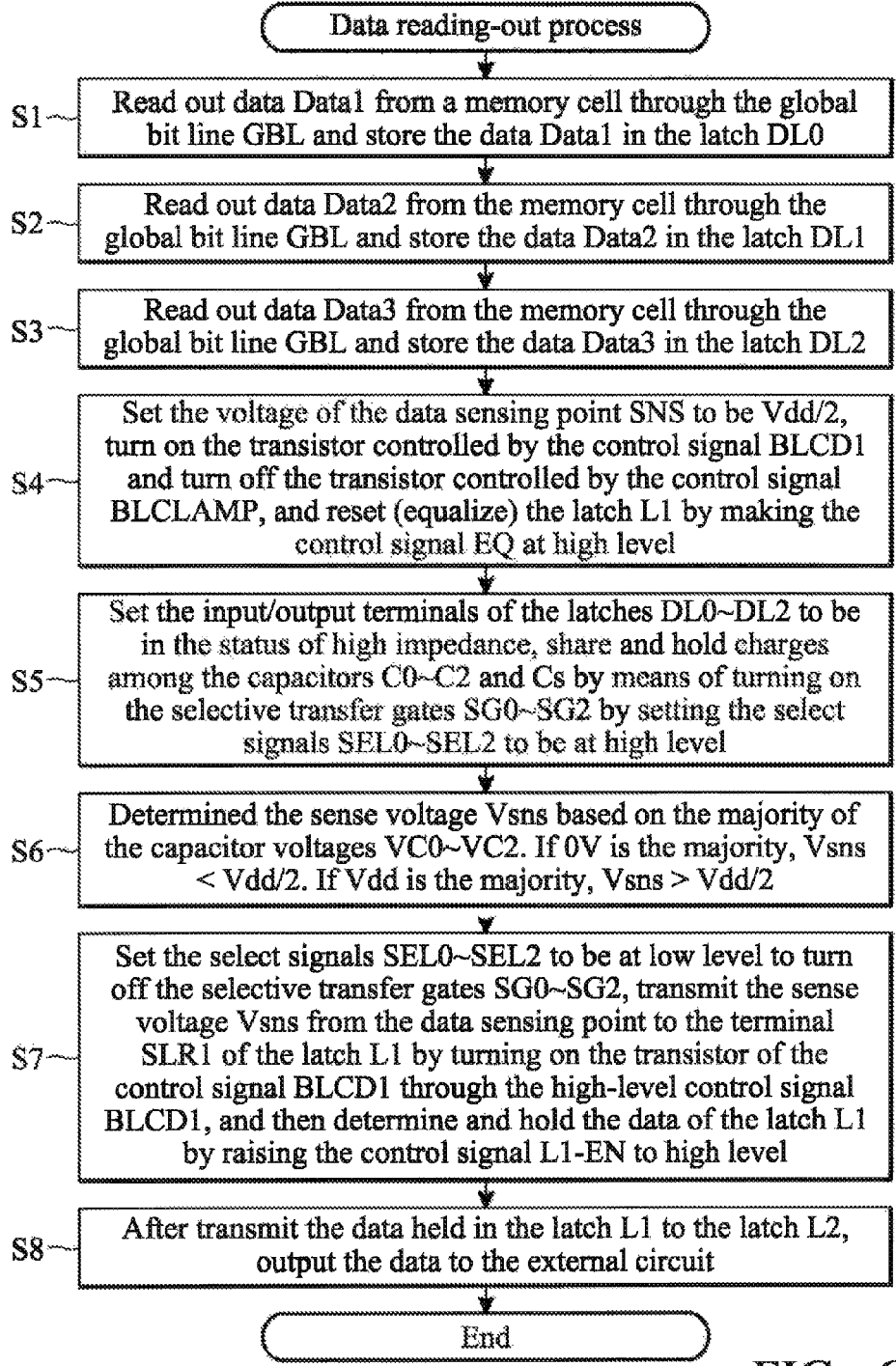
FIG. 6 is a flow chart of the data reading-out process of FIG. 4.

FIG. 6 is a flow chart of a data reading-out process relating to one read-out data of FIG. 4.

In step S1 of FIG. 6, data Data1 is read out from a memory cell through the global bit line GBL and stored in the latch DL0. In step S2, data Data2 is read-out from the memory cell, which is the same as in step S1, through the global bit line GBL and stored in the latch DL1. In step S3, data Data3 is read-out from the memory cell, which is the same as in steps S1 and S2, through the global bit line GBL and stored in the latch DL2. Here, when reading-out the data Data1, the potential of the data Data1 reflected on the data sensing point SNS through the global bit line GBL is sensed by the latch L1 and is latched into the latch L1. Then, the voltage of the Data1, which is amplified to the amplitude of 0V and the power source voltage Vdd, is transmitted from the latch L1 to the data sensing point SNS and then transmitted to and stored in the latch DLn. Next, in step S4, for the data sensing point SNS, the voltage of the data sensing point SNS is set to be Vdd/2 through a predetermined control MOS transistor. The transistor controlled by the control signal BLCD1 is turned on and the transistor controlled by the control signal BLCLAMP is turned off. And the latch L1 is reset (equalized) by making the control signal EQ at a high level. Then, in step S5, the input/output terminals of the latches DL0~DL2 are set to be in the status of high impedance, and charges among the capacitors C0~C2 and Cs are charge-shared by means of turning on the selective transfer gates SG0~SG2 by setting the select signals SEL0~SEL2 to be at a high level and then held. In step S6, the sense voltage Vsns of the data sensing point SNS is determined by the majority of the capacitor voltages VC0~VC2.

(A) If 0V is the majority, Vsns<Vdd/2.
(B) If Vdd is the majority, Vsns>Vdd/2.

In step S7, the select signals SEL0~SEL2 are set to be at a low level to turn off the selective transfer gates SG0~SG2, the sense voltage Vsns is transmitted from the data sensing point SNS to the terminal SLR1 of the latch L1 by turning on the transistor of the control signal BLCD1 through the high-level control signal BLCD1, and then the control signal L1-EN is raised to a high level to determine and hold the data of the latch L1. Moreover, in step S8, after the data held in the latch L1 is transmitted to the latch L2, the data is output to the external circuit, and then the process ends.

As described above, according to the embodiment, after each of the plurality of data read-out from the same memory cell is selectively stored in the latch LTn and the capacitor Cn of one of the latch circuits DL0~DL2 in sequence, the plurality of capacitors is connected in parallel and the charges are charge-shared and held, and thus the voltage of the read-out data can be averaged and the data of the memory cell can be read-out according to the majority rule. Accordingly, the process time can be drastically shortened while the circuit size can be reduced compared with the prior arts.

In the first embodiment as described above, though three latch circuits DLn are used, the invention is not limited thereto. For example, the majority rule using an odd number of latch circuits DLn not less than three can be performed.

Second Embodiment

Figure 7:
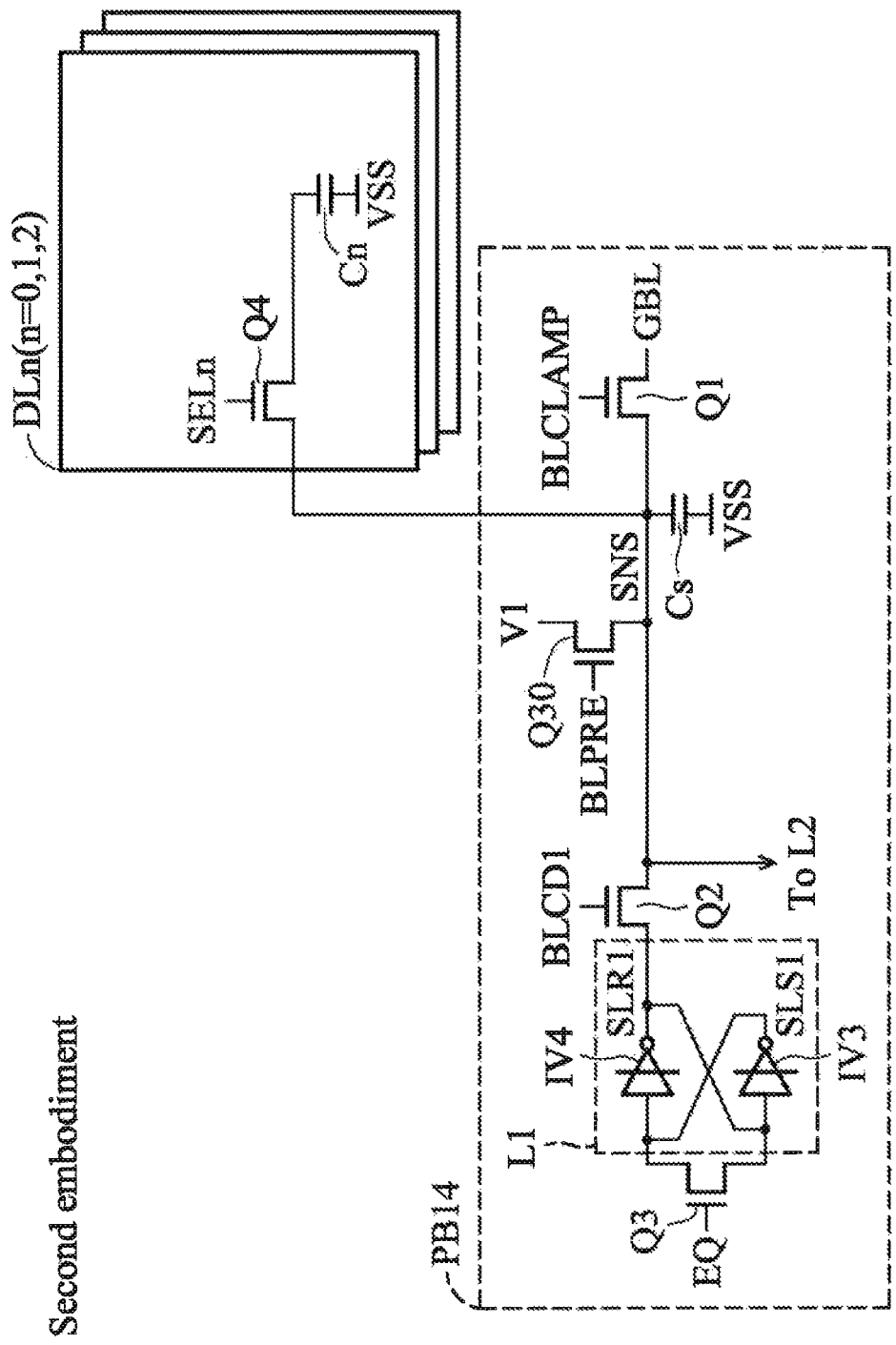
FIG. 7 is a circuit diagram showing a detailed configuration of a page buffer used in a NAND-type flash EEPROM according to the second embodiment of the invention and its peripheral circuit.

FIG. 7 is a circuit diagram showing a detailed configuration of the page buffer 14 used in the NAND-type flash EEPROM according to the second embodiment of the invention and its peripheral circuit (except the latch circuit L2). Regarding the circuit according to the second embodiment, compared with the circuit according to the first embodiment, in each latch circuit DLn:

(1) the transfer gate SGn is replaced by only a MOS transistor Q4; and
(2) the latch LTn is deleted.

Here, the voltage VSEL of the select control signal SELn is set to be higher than Vdd (power source voltage)+Vth (the threshold voltage of the MOS transistor Q4). Moreover, the capacitor Cn operates as a dynamic latch. According to the configuration described above, the circuit according to the second embodiment has the same operations and the same effects as the circuit according to the first embodiment.

Third Embodiment

Figure 8:
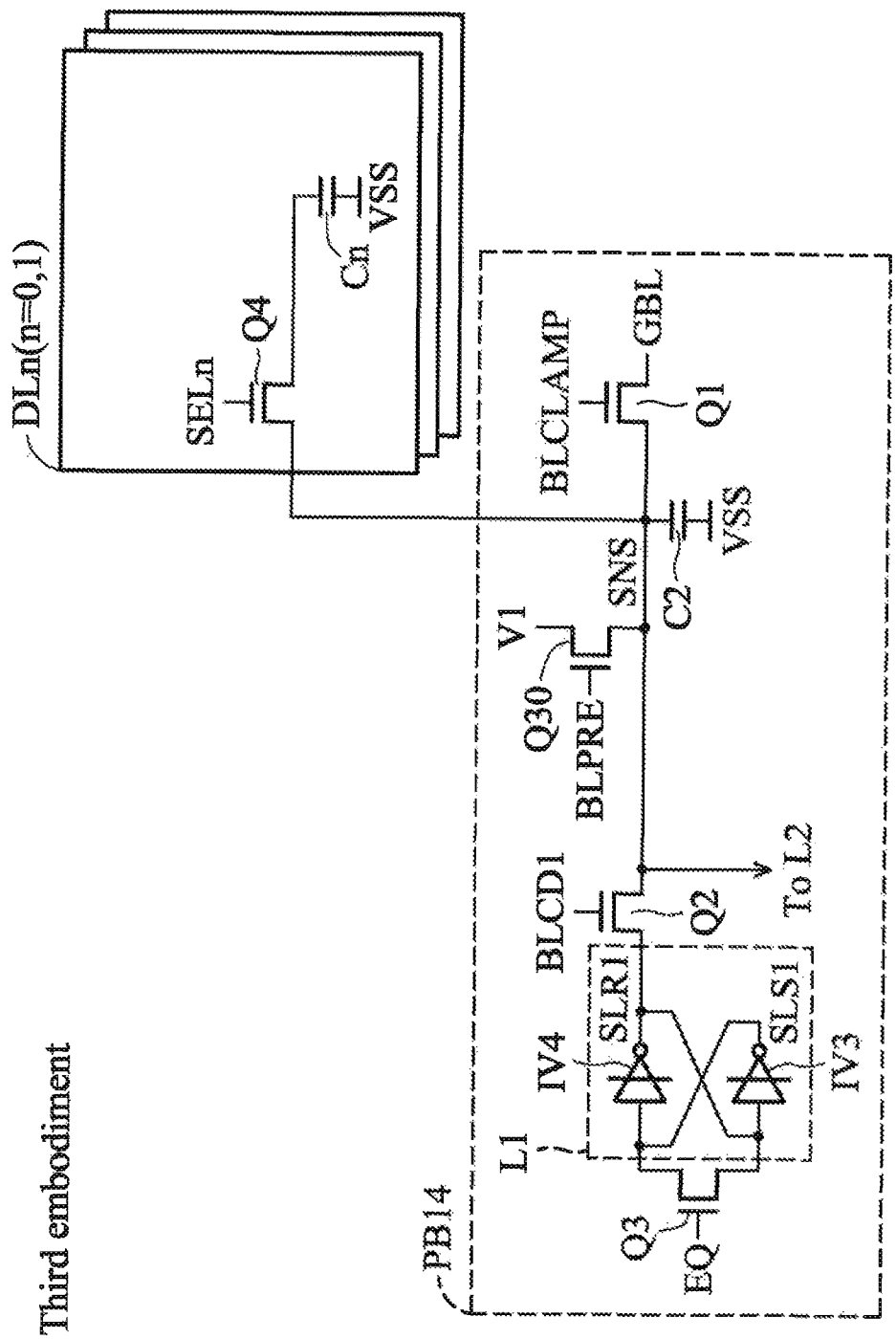
FIG. 8 is a circuit diagram showing a detailed configuration of a page buffer used in a NAND-type flash EEPROM according to the third embodiment of the invention and its peripheral circuit.

FIG. 8 is a circuit diagram showing a detailed configuration of the page buffer 14 used in the NAND-type flash EEPROM according to the third embodiment of the invention and its peripheral circuit (except the latch circuit L2). Compared with the circuit according to the second embodiment, in the circuit according to the third embodiment:

(1) the latch circuit DL2 is removed; and
(2) in replace of the latch circuit DL2, the capacitor C2 where the last data is held is provided in the position of the capacitor Cs.

Here, in the embodiment, the timing chart is a little bit different from FIG. 5. Pre-charging the data sensing point SNS to ½ Vdd by turning on the signal BLPRE is not performed, and the signal BLCD1 is off in advance and then turned on at the time point when the result of the charge-sharing is written into the latch L1 after the charge-sharing of the capacitors C0~C2 is performed. Moreover, since the equalizing operation to ½ Vdd of the node of the latch L1 is performed by turning on the signal EQ, there's no problem with the configuration. According to the configuration described above, the circuit according to the third embodiment has the same operations and the same effects as the circuits according to the first and the second embodiment. In addition, the configuration according to the third embodiment can be applied to the first, the second, the fourth, the fifth, the sixth, the seventh, the eighth, the ninth, the tenth, the eleventh or the twelfth embodiment. And also, changes in timing charts of the other embodiments may be needed. However, since the changes are not substantially related to the invention, description thereof is skipped.

Fourth Embodiment

Figure 9:
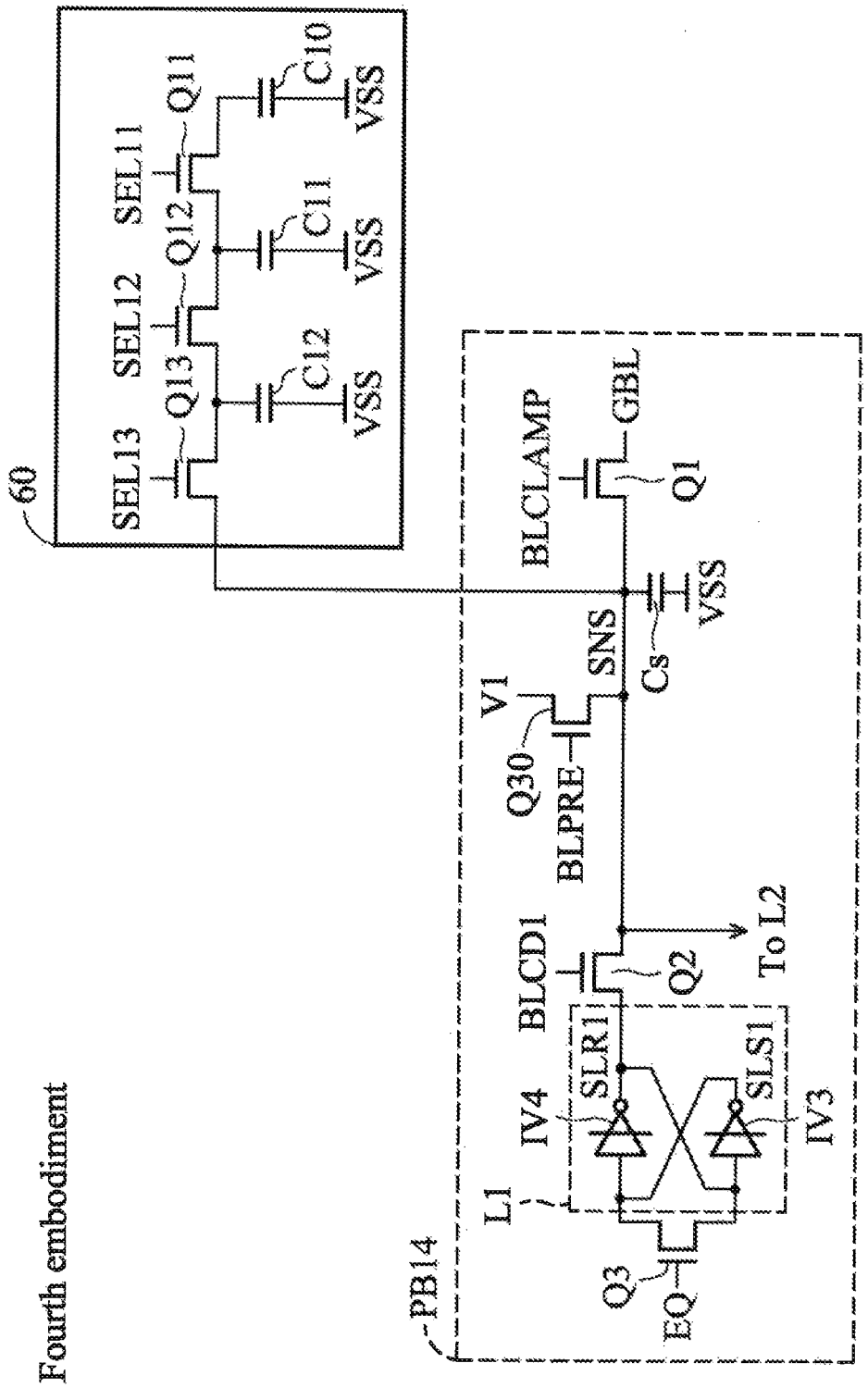
FIG. 9 is a circuit diagram showing a detailed configuration of a page buffer used in a NAND-type flash EEPROM according to the fourth embodiment of the invention and its peripheral circuit.

FIG. 9 is a circuit diagram showing a detailed configuration of the page buffer 14 used in the NAND-type flash EEPROM according to the fourth embodiment of the invention and its peripheral circuit (except the latch circuit L2). Compared with the circuit according to the second embodiment, in the circuit according to the fourth embodiment:

(1) one latch circuit 60 is provided in replace of the three latch circuits DLn; and
(2) the latch circuit 60 is configured to comprise three capacitors C10, C11 and C12 and three selective MOS transistors Q11, Q12 and Q13.

Here, the three selective MOS transistors Q11, Q12 and Q13 are connected in serial. Connection point between each two of the connected MOS transistors of the selective MOS transistors Q11, Q12 and Q13 and the terminal of the MOS transistor Q11, which is the farthest point seen from the data sensing point SNS (the input/output terminal of the latch circuit 60), are connected to the capacitors C10, C11 and C12 (except for the terminal of the MOS transistor Q3 which is connected to the data sensing point SNS).

In the circuit as constructed above, first, all of the MOS transistors Q11~Q13 are on and the first read-out data Data1 is transmitted to and held in the capacitor C10. Next, the MOS transistor Q11 is off, and the second read-out data Data2 is transmitted to and held in the capacitor C11. Then, the MOS transistor Q12 is off, and the third read-out data Data3 is transmitted to and held in the capacitor C12, and then the MOS transistor Q13 is off. Afterwards, the charges held in the capacitors C10~C12 are charge-shared by turning on all the MOS transistor Q11~Q13 and then held so as to calculate the average of all held voltages. The afterward process is the same as that in the first embodiment. Moreover, the first to the third read-out data are read out from the same memory cell. According to the configuration described above, the circuit according to the fourth embodiment has the same operations and the same effects as the circuit according to the first embodiment.

Fifth Embodiment

Figure 10:
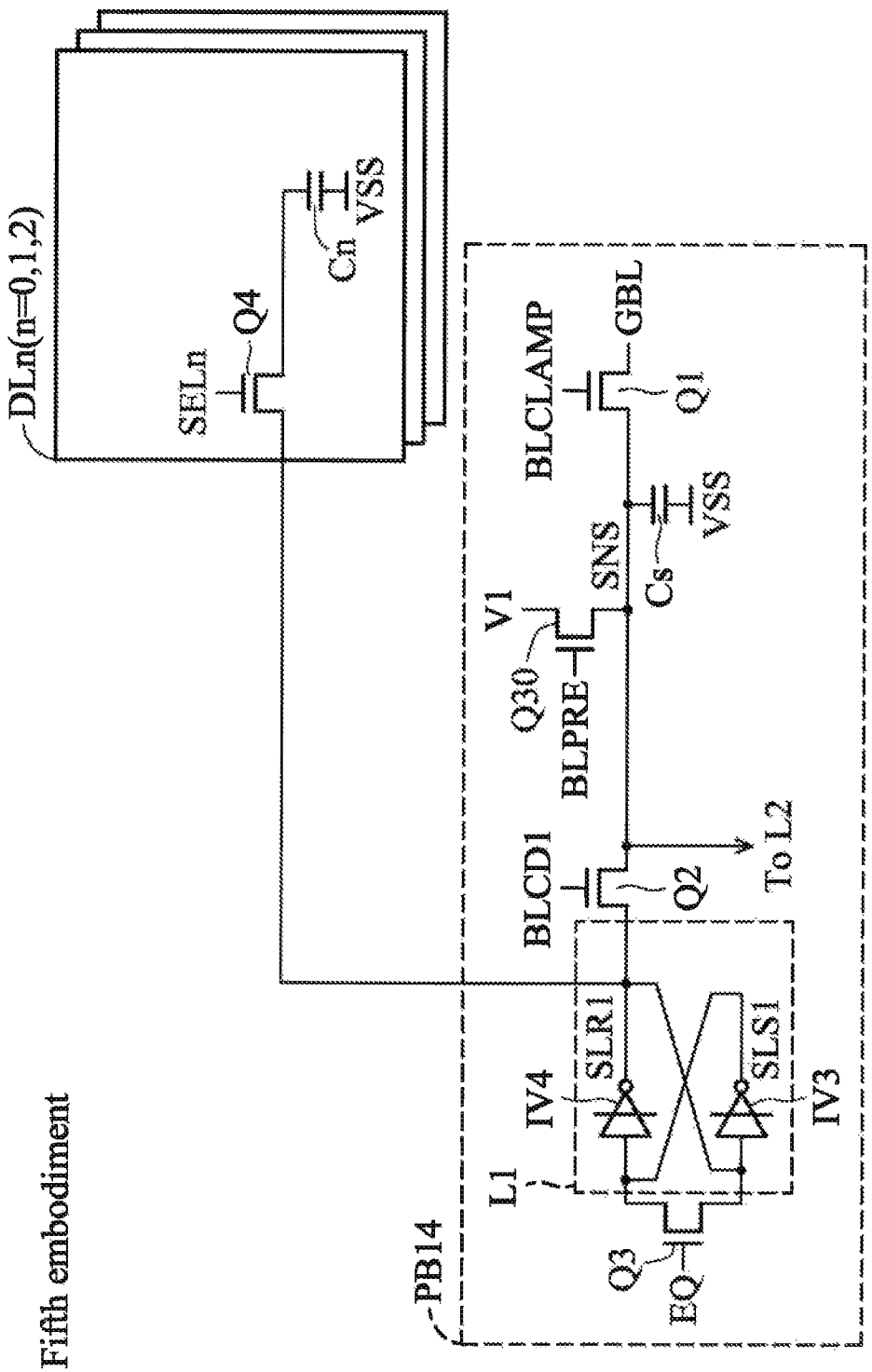
FIG. 10 is a circuit diagram showing a detailed configuration of a page buffer used in the NAND-type flash EEPROM according to the fifth embodiment of the invention and its peripheral circuit.

FIG. 10 is a circuit diagram showing a detailed configuration of the page buffer 14 used in the NAND-type flash EEPROM according to the fifth embodiment of the invention and its peripheral circuit (except the latch circuit L2). Compared with the circuit according to the second embodiment, in the circuit according to the fifth embodiment:

(1) The Three Latch Circuits DLn are Connected to the Input/Output Terminal of the Latch L1.

In the circuit as constructed above, after the first read-out data Data1 is transmitted to the latch L1, the first read-out data Data1 is transmitted to and held in the capacitor C0. Next, after the second read-out data Data2 is transmitted to the latch L1, the second read-out data Data2 is transmitted to and held in the capacitor C1. Then, after the third read-out data Data3 is transmitted to the latch L1, the third read-out data Data3 is transmitted to and held in the capacitor C2. Other operations are the same as that in the second embodiment. According to the configuration described above, the circuit according to the fifth embodiment has the same operations and the same effects as the circuit according to the second embodiment.

Sixth Embodiment

Figure 11:
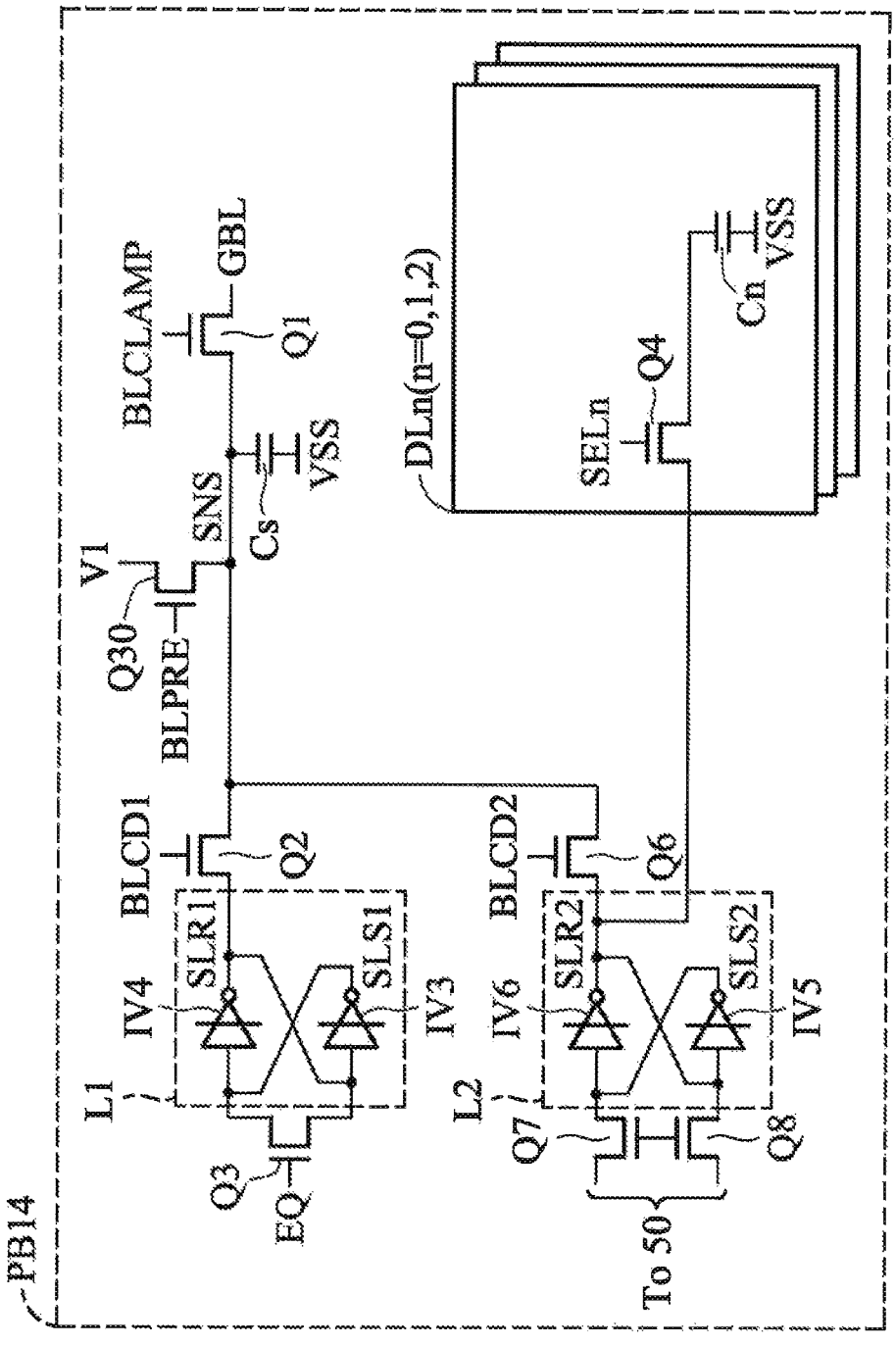
FIG. 11 is a circuit diagram showing a detailed configuration of a page buffer used in a NAND-type flash EEPROM according to the sixth embodiment of the invention and its peripheral circuit.

FIG. 11 is a circuit diagram showing a detailed configuration of the page buffer 14 used in the NAND-type flash EEPROM according to the sixth embodiment of the invention and its peripheral circuit. Compared with the circuit according to the second embodiment, in the circuit according to the sixth embodiment:

(1) the three latch circuits DLn are connected to the input/output terminal of the latch L2. In FIG. 11, the data sensing point SNS is connected to the input/output terminal of the latch L2 through a selective MOS transistor Q6, and the latch is configured to comprise two clocked inverters IV5 and IV6. Data stored in the latch L2 is transmitted to the input/output buffer 50 through MOS transistors Q7 and Q8.

In the circuit as constructed above, the first read-out data Data1 is first transmitted to the latch L1, and after transmitted to the latch L2, the first read-out data Data1 is then transmitted to and held in the capacitor C0. Next, the second read-out data Data2 is first transmitted to the latch L1, and after transmitted to the latch L2, the second read-out data Data2 is then transmitted to and held in the capacitor C1. Moreover, the third read-out data Data3 is first transmitted to the latch L1, and after transmitted to the latch L2, the third read-out data Data3 is then transmitted to and held in the capacitor C2. Other operations are the same as that in the second embodiment. According to the configuration described above, the circuit according to the sixth embodiment has the same operations and the same effects as the circuit according to the second embodiment.

Seventh Embodiment

Figure 12:
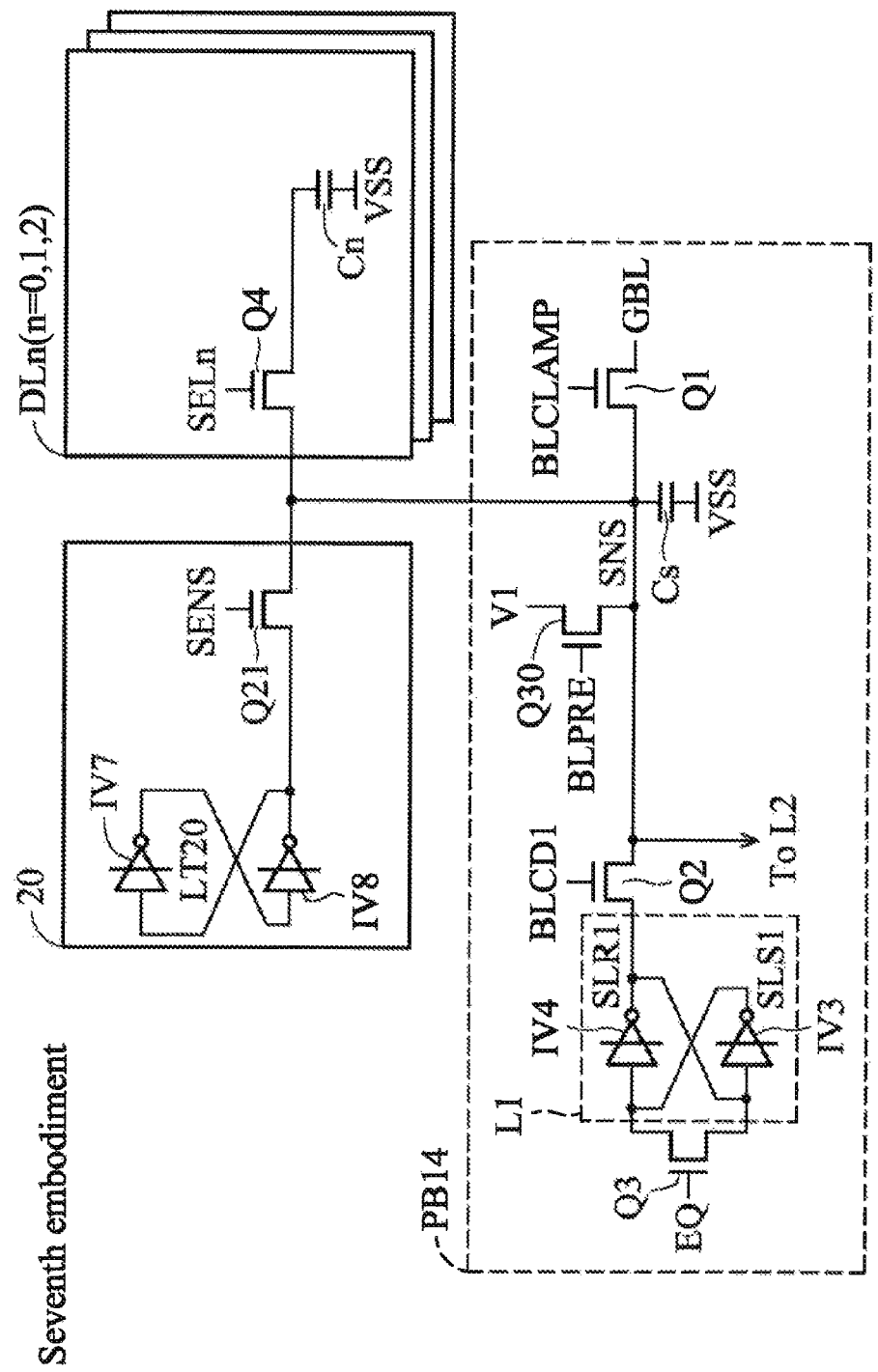
FIG. 12 is a circuit diagram showing a detailed configuration of a page buffer used in a NAND-type flash EEPROM according to the seventh embodiment of the invention and its peripheral circuit.

FIG. 12 is a circuit diagram showing a detailed configuration of the page buffer 14 used in the NAND-type flash EEPROM according to the seventh embodiment of the invention and its peripheral circuit (except the latch circuit L2). Compared with the circuit according to the second embodiment, in the circuit according to the seventh embodiment:

(1) a sensing circuit 20 connected to the three latch circuits DLn is provided. Here, the sensing circuit 20 comprises a selective MOS transistor Q21 and a flip-flop type latch LT20 formed by two clocked inverters IV7 and IV8 for detecting data voltage and holding the data voltage.

In the circuit as constructed above, firstly, a voltage of a control signal SENS is set to be Vdd/2. Next, the charge-sharing of the capacitors C0~C2 is performed by turning on the control signal SELn, and the node SNS voltage after the charge sharing is sensed in the sensing circuit by turning on the signal SENS. After stored in the latch LT20, the sensed voltage is stored in the capacitor Cn of each latch circuit DLn. Here, since the latch L1 forms a sense amplifier performing reading-out from the memory cells through the global bit line GBL and the sensed voltage of the latch L1 is conventionally different from the sensed voltage=½ Vdd of the charge-sharing of the capacitors C0~C2, the sensing circuit 20 is provided to be capable of not only making the sensed voltage become ½Vdd but also adjusting the sensed voltage so as to compensate the effect of the capacitor Cs of the node SNS. Accordingly, in addition to the effect of the second embodiment, enlarging the sensing margin of the averaging of the voltages stored in the capacitors Cn is a special advantage for the embodiment.

Eighth Embodiment

Figure 13:
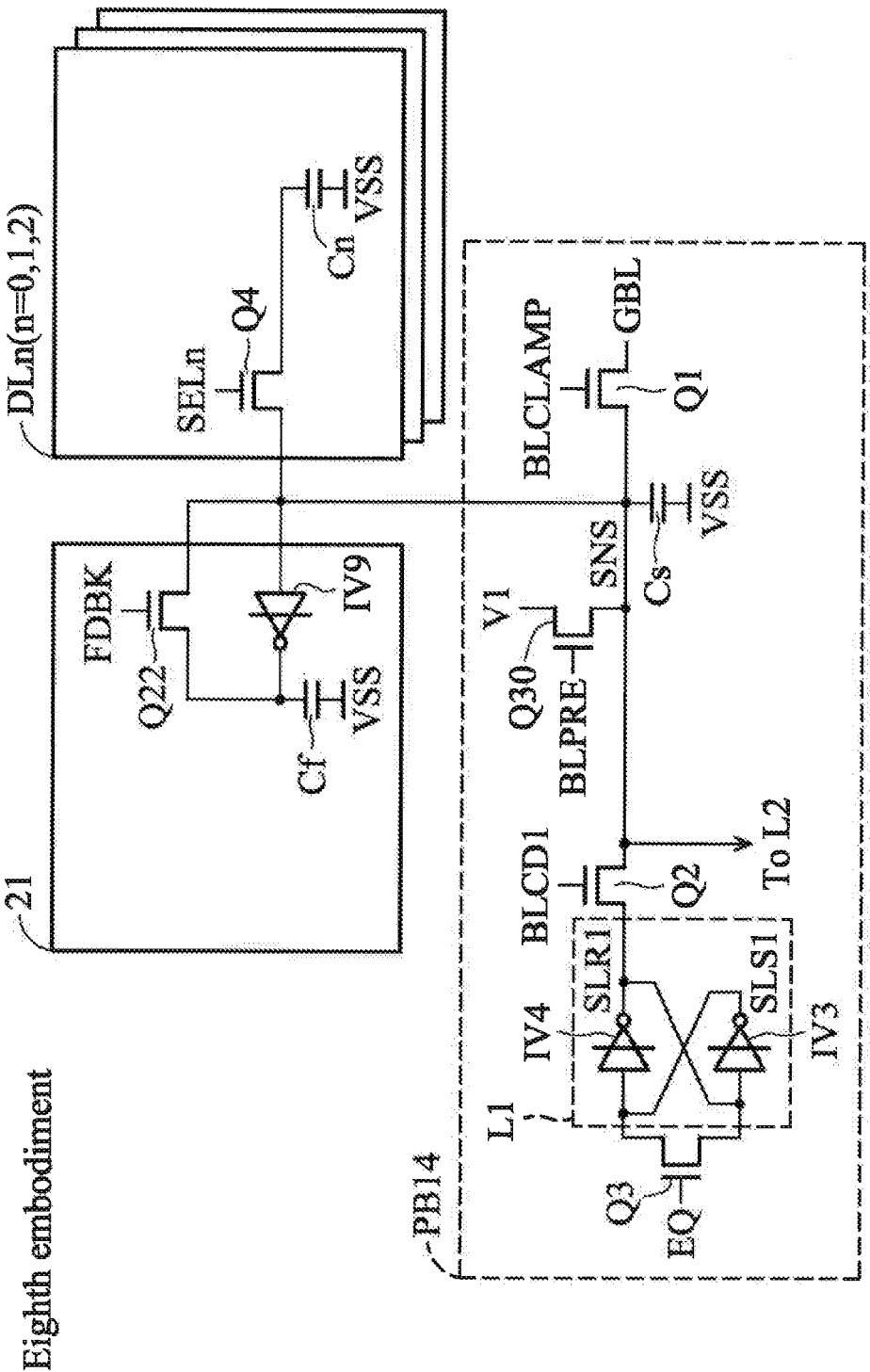
FIG. 13 is a circuit diagram showing a detailed configuration of a page buffer used in a NAND-type flash EEPROM according to the eighth embodiment of the invention and its peripheral circuit.

FIG. 13 is a circuit diagram showing a detailed configuration of the page buffer 14 used in the NAND-type flash EEPROM according to the eighth embodiment of the invention and its peripheral circuit (except the latch circuit L2). Compared with the circuit according to the second embodiment, in the circuit according to the eighth embodiment:

(1) a sensing circuit 21 connected to the three latch circuits DLn is provided. Here, the sensing circuit 21 comprises a clocked inverter IV9 for reading out data, a capacitor Cf for holding the data voltage and a selective MOS transistor Q22 for outputting the held voltage to the latch circuit DLn.

In the circuit as constructed above, though the sensing operation of the capacitors C0~C2 after the charge-sharing thereof performed in the sensing circuit 21 is the same as in the seventh embodiment, the sensing operation is performed by the inverter IV9, and the latching is performed by the capacitor Cf which acts as a dynamic latch. In addition, when transmitting data to the latch L1 or L2, the inverter IV9 is set in an inactive status and the control signal FDBK is set to high to turn on the MOS transistor Q22 so as to transmit the voltage of the capacitor Cf to the SNS to perform the sensing operation in the latch L1 or L2. Accordingly, in addition to the effect of the second embodiment, and in addition to enlarging the sensing margin as in the seventh embodiment, the small size of the sensing circuit 21 is a special advantage for the embodiment.

Ninth Embodiment

Figure 14:
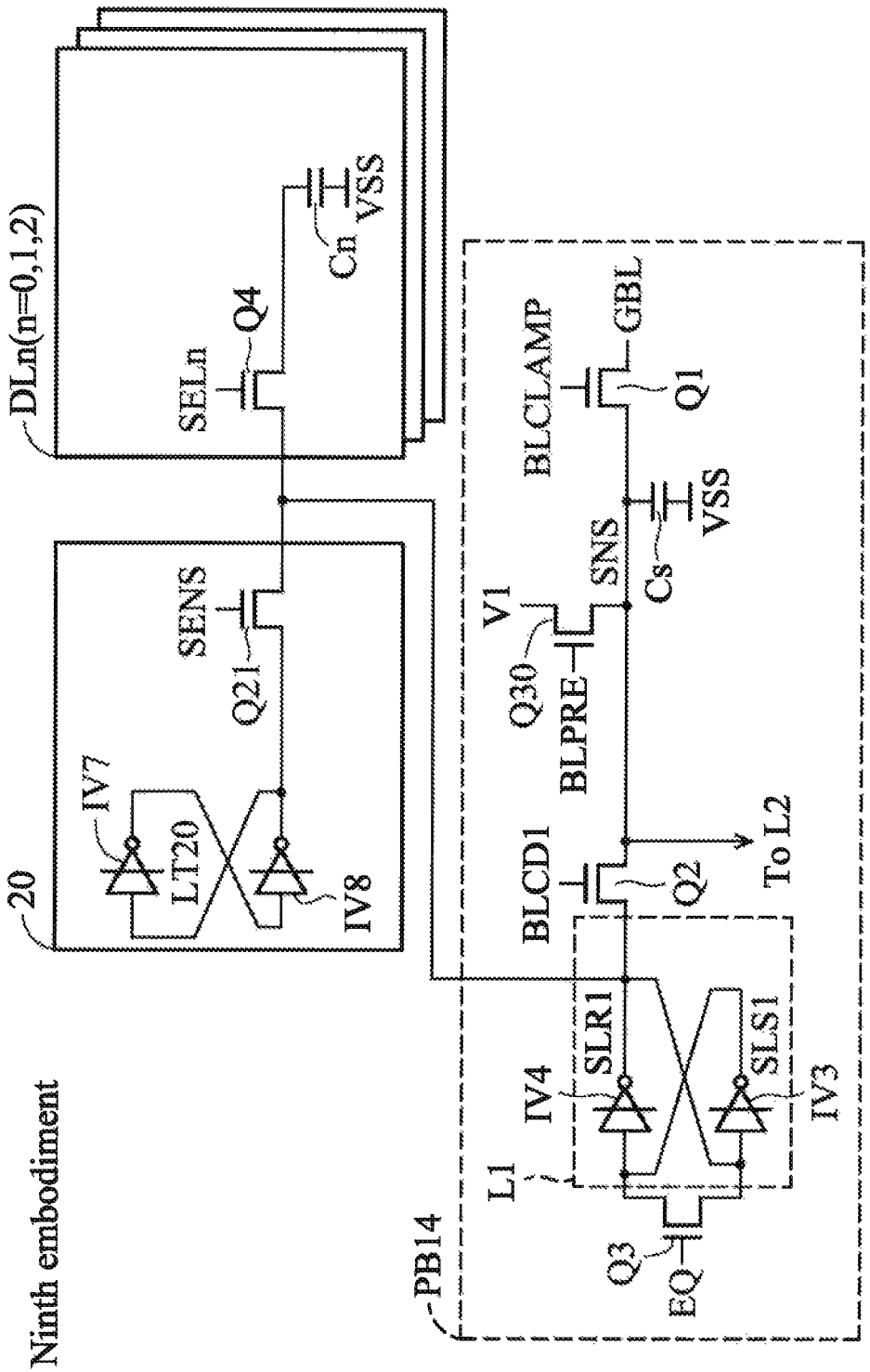
FIG. 14 is a circuit diagram showing a detailed configuration of a page buffer used in a NAND-type flash EEPROM according to the ninth embodiment of the invention and its peripheral circuit.

FIG. 14 is a circuit diagram showing a detailed configuration of the page buffer 14 used in the NAND-type flash EEPROM according to the ninth embodiment of the invention and its peripheral circuit (except the latch circuit L2). Compared with the circuit according to the seventh embodiment, in the circuit according to the ninth embodiment:

(1) a circuit including the latch circuits DLn and the sensing circuit 20 is connected to the input/output terminal of the latch L1.

The circuit as constructed above has the same effects as the seventh embodiment.

Tenth Embodiment

Figure 15:
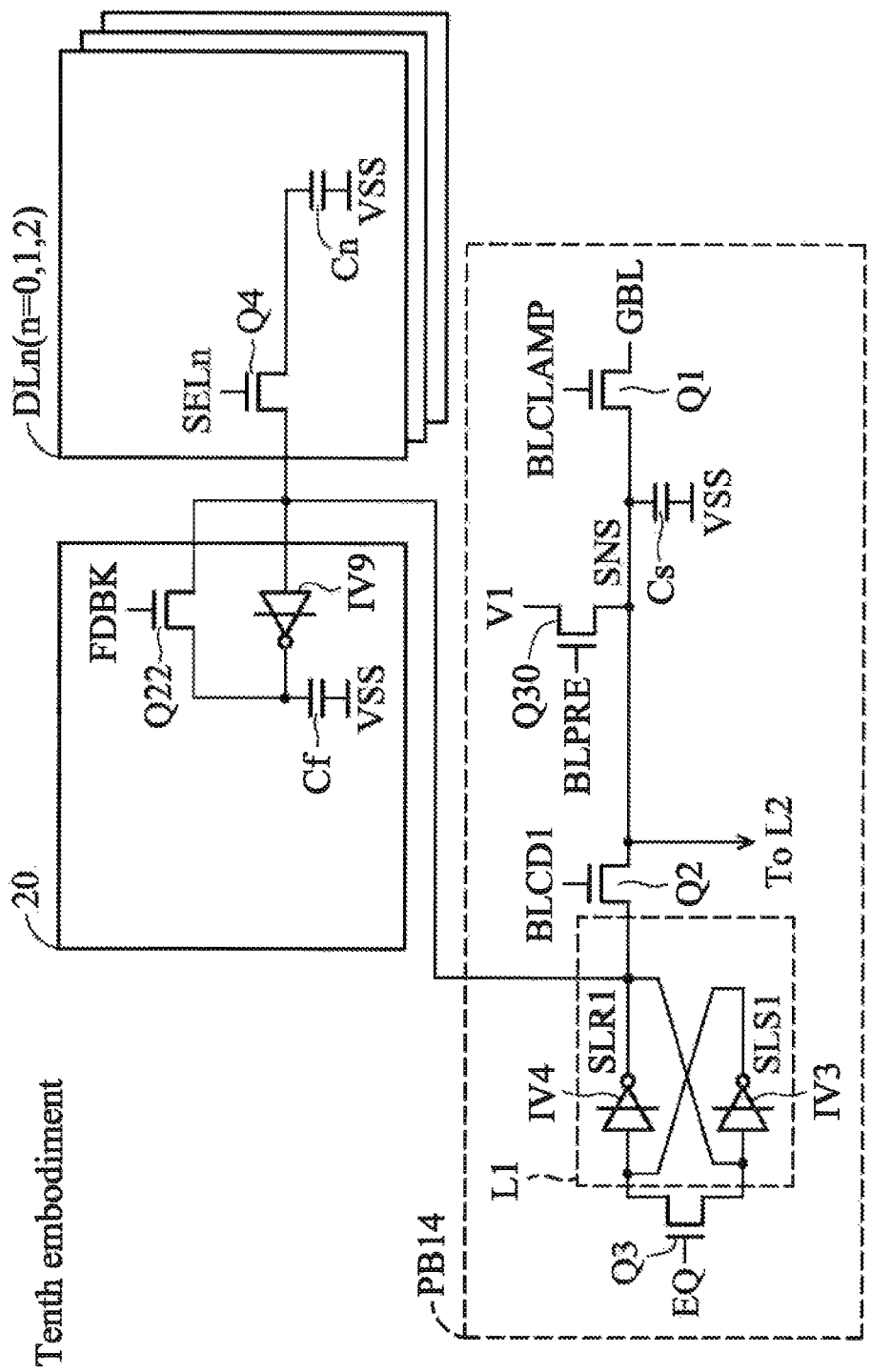
FIG. 15 is a circuit diagram showing a detailed configuration of a page buffer used in a NAND-type flash EEPROM according to the tenth embodiment of the invention and its peripheral circuit.

FIG. 15 is a circuit diagram showing a detailed configuration of the page buffer 14 used in the NAND-type flash EEPROM according to the tenth embodiment of the invention and its peripheral circuit (except the latch circuit L2). Compared with the circuit according to the eighth embodiment, in the circuit according to the tenth embodiment:

(1) a circuit including the latch circuits DLn and the sensing circuit 21 is connected to the input/output terminal of the latch L1.

The circuit as constructed above has the same effects as the eighth embodiment.

Eleventh Embodiment

Figure 16:
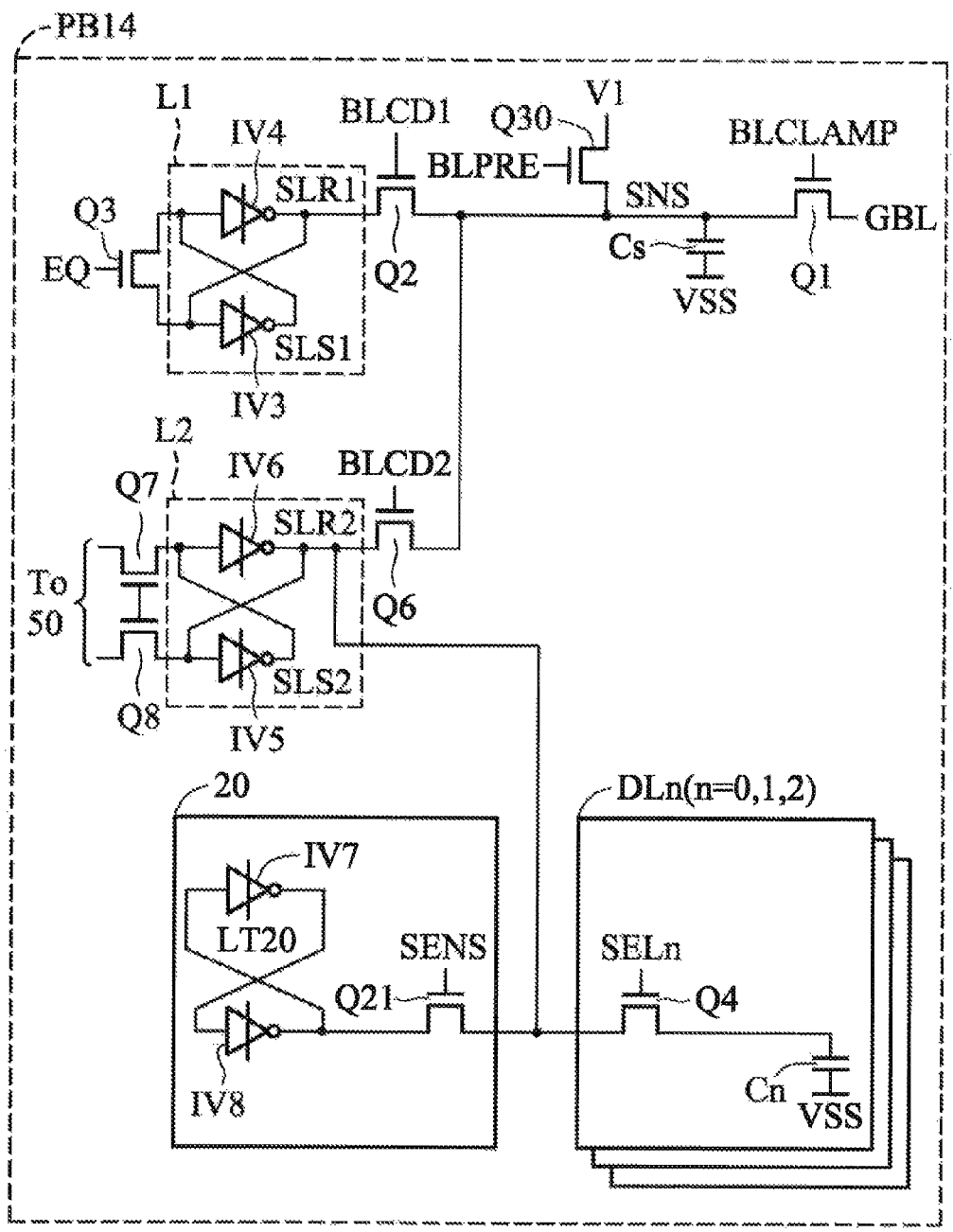
FIG. 16 is a circuit diagram showing a detailed configuration of a page buffer used in a NAND-type flash EEPROM according to the eleventh embodiment of the invention and its peripheral circuit.

FIG. 16 is a circuit diagram showing a detailed configuration of the page buffer 14 used in the NAND-type flash EEPROM according to the eleventh embodiment of the invention and its peripheral circuit. Compared with the circuit according to the seventh embodiment, in the circuit according to the eleventh embodiment:

(1) a circuit including the latch circuits DLn and the sensing circuit 20 is connected to the input/output terminal of the latch L2.

The circuit as constructed above has the same effects as the seventh embodiment.

In the eleventh embodiment described above, though the sensing circuit 20 is provided, the invention is not limited thereto. For example, if the sensing circuit 20 is not provided, the function of the sensing circuit 20 can be carried out by the latch L2. Since the sensing level of the latch L2 is set for the data of the data bus, the level can be Vdd/2. Moreover, in this case, the embodiment becomes the same as the sixth embodiment in view of circuit.

Twelfth Embodiment

Figure 17:
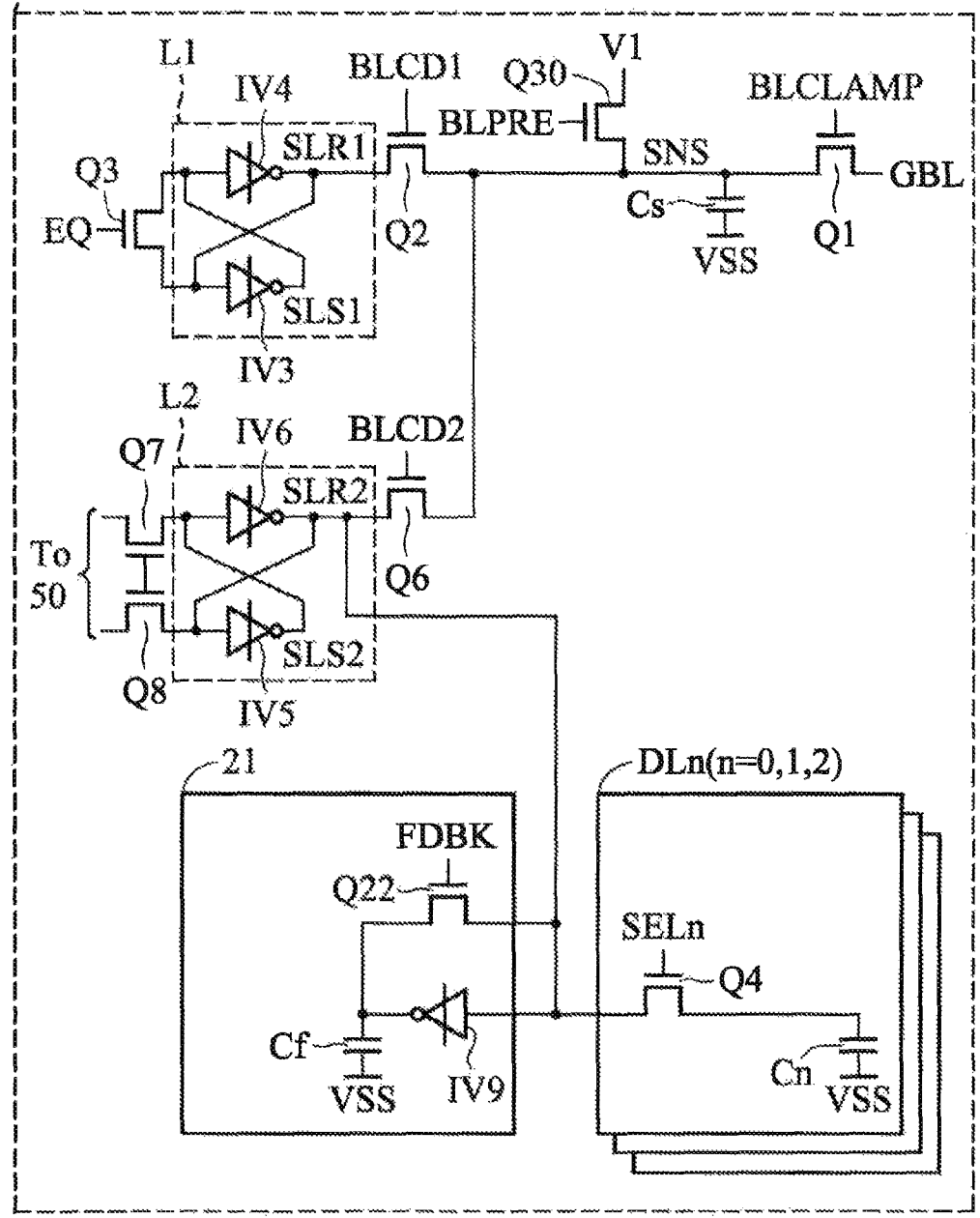
FIG. 17 is a circuit diagram showing a detailed configuration of a page buffer used in a NAND-type flash EEPROM according to the twelfth embodiment of the invention and its peripheral circuit.
Figure 18:
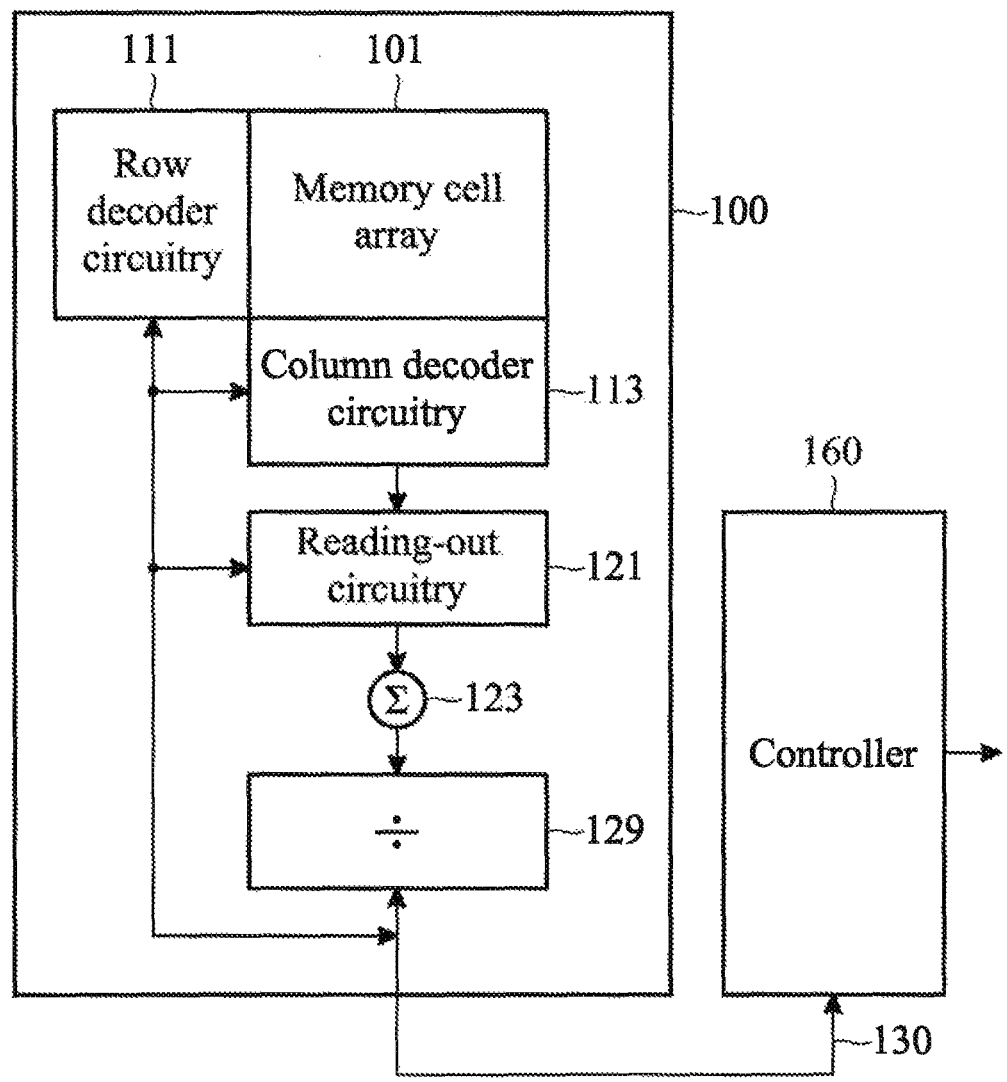
FIG. 18 illustrates a configuration example of an EEPROM according to the first conventional example.
Figure 19:
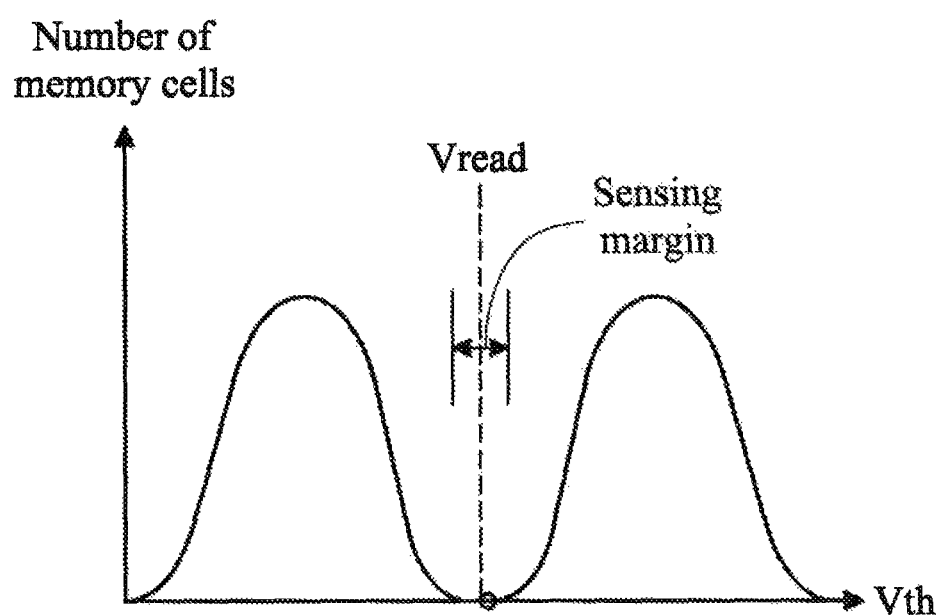
FIG. 19 is a graphic illustrating the number of memory cells versus the threshold voltage for explaining the sensing margin in the EEPROM of FIG. 18.
Figure 20:
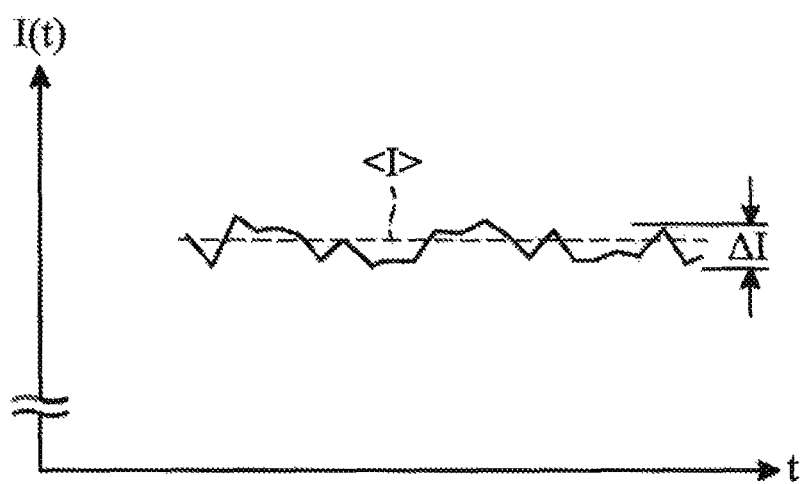
FIG. 20 is a graphic illustrating time variations in reading-out current I(t) in the EEPROM of FIG. 18.
Figure 21:
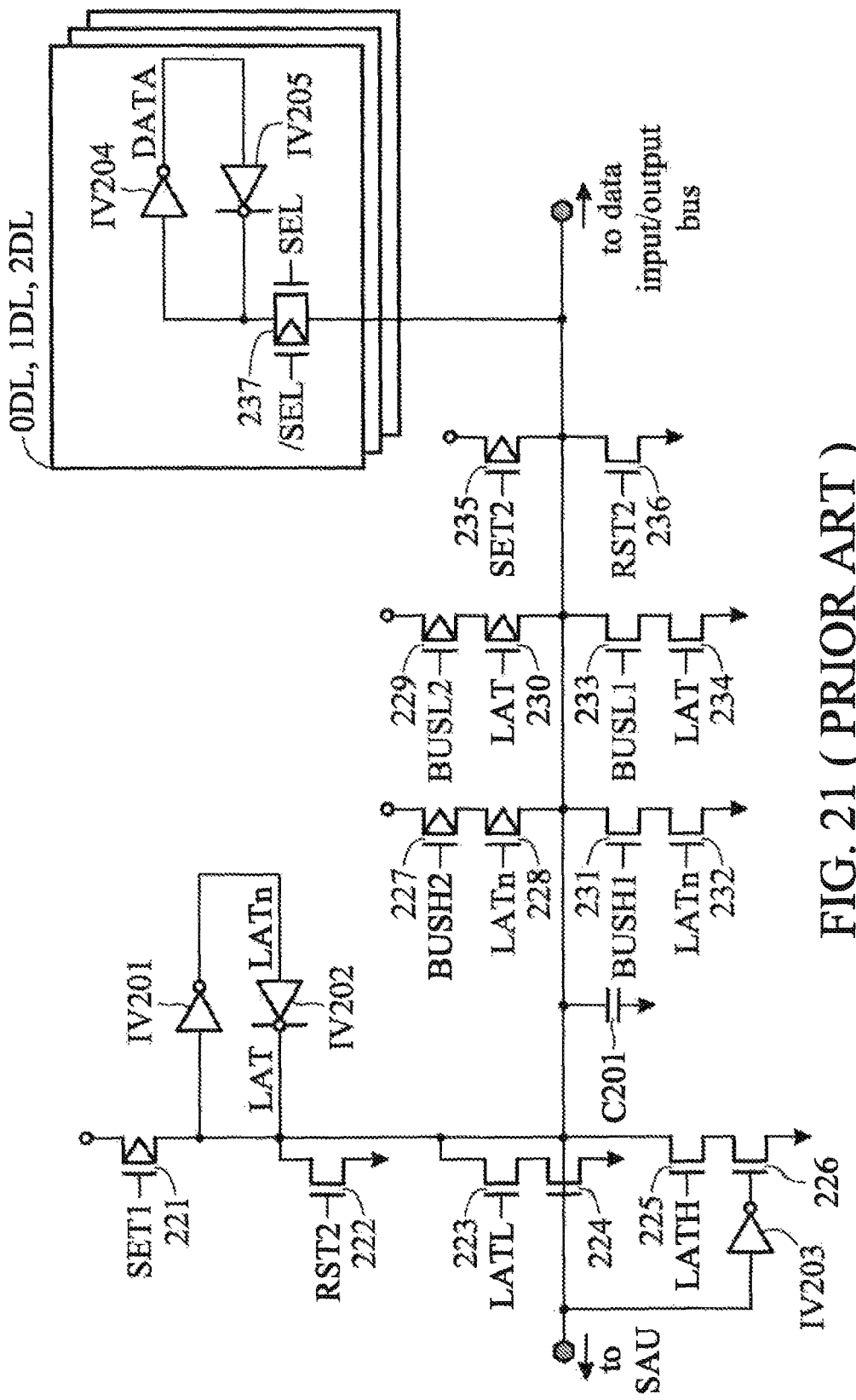
FIG. 21 is a block diagram illustrating a configuration example of a latch unit in a sense amplifier circuit in an EEPROM according to the second conventional example.

FIG. 17 is a circuit diagram showing a detailed configuration of the page buffer 14 used in the NAND-type flash EEPROM according to the twelfth embodiment of the invention and its peripheral circuit. Compared with the circuit according to the ninth embodiment, in the circuit according to the twelfth embodiment:

(1) a circuit including the latch circuits DLn and the sensing circuit 21 is connected to the input/output terminal of the latch L2.

The circuit as constructed above has the same effects as the ninth embodiment. The function of the sensing circuit 21 can be carried out by the latch L2 instead, as in the eleventh embodiment.

Modified Embodiments

In the embodiments described above (except the fourth embodiment), though three latch circuits DL0~DL2 are used, an odd number (not less than three) of latch circuits DL0~DLN can also be used to implement the majority rule. Moreover, in the fourth embodiment, though three capacitors C10~C12 are used, an odd number (not less than three) of capacitors can also be used to implement the majority rule.

In the fifth to the twelfth embodiments, though the latch circuit DLn according to the second embodiment is used, the invention is not limited thereto. For example, the latch circuit according to the fourth embodiment can also be used.

In the embodiments described above, though the NAND-type flash memory is used to describe the embodiment, the invention is not limited thereto. The embodiments can be applied to a non-volatile semiconductor memory device capable of writing data into floating gates, such as a NOR type flash EEPROM, etc.

Comparison in Process Lime Between the First Embodiment and the Second Conventional Example According to the estimation of the preset invention, in the case where one step takes 0.1 micro second, since computation of logical addition and inversion, logical product and inversion and so on is needed, the process time of 4.5 micro seconds is required for the circuit according to the second conventional example. By comparison, in the same case, since the computation can be omitted due to the averaging of voltages by capacitors, the process time only takes 0.6 micro second for the first embodiment of the invention. Therefore, the process time can be drastically shortened and the circuit size can be reduced compared to the prior arts.

INDUSTRIAL APPLICABILITY

As described above, according to the non-volatile semiconductor memory device and the reading-out method thereof, in the non-volatile semiconductor memory device performing reading-out of data by using the majority rule, the process time can be drastically shortened and the circuit size can be reduced compared to the prior arts.

What is claimed is:

1. A non-volatile semiconductor memory device, outputting a data value determined according to a majority rule by reading-out data from each of a plurality of memory cells for an odd number of times not less than three times, wherein the plurality of memory cells is connected to corresponding word lines and connected to and between a plurality of bit lines and a plurality of source lines, the non-volatile semiconductor memory device comprising:
   an odd number of latch circuits, which are not less than three latch circuits, each of which comprising a capacitor for selectively holding a voltage of each of the data read-out from the memory cell for the odd number of times in sequence; and
   a control circuit, connecting the capacitor of each of the odd number of latch circuits in parallel after the capacitor of each of the odd number of latch circuits selectively holding the voltage of each of the data read-out from the memory cell for the odd number of times in sequence, and determining the data value by the majority rule based on a composite voltage of the capacitor of each of the odd number of latch circuits connected in parallel.

2. The non-volatile semiconductor memory device as claimed in claim 1, wherein each of the odd number of latch circuits comprises a latch consisted of two inverters connected to each other and the capacitor.

3. The non-volatile semiconductor memory device as claimed in claim 1, wherein each of the odd number of latch circuits comprises a selective transistor which is switched to or not to select the latch circuit and the capacitor.

4. The non-volatile semiconductor memory device as claimed in claim 1, further comprising:
   a latch circuit in replace of the odd number of latch circuits, comprising an odd number of transistors connected to each other in serial and an odd number of capacitors connected to connection points among the odd number of transistors and a transistor terminal which is farthest away from an input/output terminal of the latch circuit.

5. The non-volatile semiconductor memory device as claimed in claim 1, further comprising:
   a sensing circuit connected to each of the odd number of latch circuits, connecting the capacitor of each of the odd number of latch circuits in parallel and determining the data value by the majority rule based on the composite voltage of the capacitor of each of the odd number of latch circuits connected in parallel.

6. The non-volatile semiconductor memory device as claimed in claim 5, wherein the sensing circuit further comprises:
   a selective transistor which is switched to or not to select the sensing circuit; and
   a latch, comprising two inverters, sensing and holding voltage of each of the data.

7. The non-volatile semiconductor memory device as claimed in claim 5, wherein the sensing circuit further comprises:
   an inverter, sensing and outputting the voltage of each of the data;
   a holding capacitor, holding the voltage from the inverter; and
   a selective transistor which is switched to or not to output the voltage held by the holding capacitor to a circuit reading-out the data from each of the plurality of memory cells.

8. The non-volatile semiconductor memory device as claimed claim 1, further comprising:
   another capacitor provided in a circuit where reading-out data from the plurality of memory cells is performed through a data sensing point connected to a sensing circuit for reading-out, wherein the another capacitor is connected to the data sensing point, and
   wherein the another capacitor is used in replace of one of the odd number of latch circuits.

9. The non-volatile semiconductor memory device as claimed in claim 1 wherein each latch circuit is connected to the data sensing point.

10. The non-volatile semiconductor memory device as claimed in claim 1, wherein each latch circuit is connected to an input/output terminal of one latch circuit in a page buffer of the non-volatile semiconductor memory device.

11. A reading-out method of a non-volatile semiconductor memory device for outputting a data value determined according to a majority rule by reading-out data from each of a plurality of memory cells for an odd number of times not less than three times, wherein the plurality of memory cells are connected to corresponding word lines and connected to and between a plurality of bit lines and a plurality of source lines, and the non-volatile semiconductor memory device comprises an odd number of latch circuits, which are not less than three latch circuits, each of which comprising a capacitor for selectively holding a voltage of each of the data read-out from the memory cell for the odd number of times in sequence, the reading-out method comprising:

connecting the capacitor of each of the odd number of latch circuits in parallel after the capacitor of each of the odd number of latch circuits selectively holding the voltage of each of the data read-out from the memory cell for the odd number of times in sequence, and determining the data value by the majority rule based on a composite voltage of the capacitor of each of the odd number of latch circuits connected in parallel.

* * * * *